US009680273B2

(12) United States Patent
Light et al.

(10) Patent No.: US 9,680,273 B2
(45) Date of Patent: Jun. 13, 2017

(54) ELECTRICAL CONNECTOR WITH ELECTRICAL CONTACTS PROTECTED BY A LAYER OF COMPRESSIBLE MATERIAL AND METHOD OF MAKING IT

(71) Applicants: David Noel Light, Los Gatos, CA (US); Hung-Ming Wang, San Jose, CA (US); David Rodney Baker, Santa Clara, CA (US); Peter Tho Nguyen, San Jose, CA (US); Dexter Shih-Wei Pao, San Jose, CA (US)

(72) Inventors: David Noel Light, Los Gatos, CA (US); Hung-Ming Wang, San Jose, CA (US); David Rodney Baker, Santa Clara, CA (US); Peter Tho Nguyen, San Jose, CA (US); Dexter Shih-Wei Pao, San Jose, CA (US)

(73) Assignee: NEOCONIX, INC, San Jose, CA (US)

( * ) Notice: Subject to any disclaimer, the term of this patent is extended or adjusted under 35 U.S.C. 154(b) by 0 days.

(21) Appl. No.: 13/843,274

(22) Filed: Mar. 15, 2013

(65) Prior Publication Data

US 2014/0273641 A1    Sep. 18, 2014

(51) Int. Cl.
*H01R 43/16*    (2006.01)
*H01R 12/70*    (2011.01)
(Continued)

(52) U.S. Cl.
CPC ......... *H01R 43/16* (2013.01); *H01R 12/7082* (2013.01); *H01R 12/73* (2013.01);
(Continued)

(58) Field of Classification Search
USPC .......................................................... 439/66
See application file for complete search history.

(56) References Cited

U.S. PATENT DOCUMENTS 1,668,011 A    5/1928    Friedmann
2,382,771 A    8/1945    Bowers
(Continued)

FOREIGN PATENT DOCUMENTS

CN    1232242 A1    10/1999
EP    692823 A1    1/1996
(Continued)

OTHER PUBLICATIONS

E-TEC Interconnect Ltd., Patented Socketing System for the BGA/CCP Technology, www.lingmei.com.cn/BGA%20socket%20summary.pdf, Jun. 11, 2007, pp. 1-4.
(Continued)

*Primary Examiner* — Ross Gushi
(74) *Attorney, Agent, or Firm* — Kenneth A. Seaman

(57) ABSTRACT

Disclosed is an electrical connector having a substrate and movable electrical contacts which are mounted to the substrate and extend a distance D from the substrate. A layer of compressible material (such as a foam or elastomeric material) is positioned on the substrate adjacent at least some of the electrical contacts and ideally has an uncompressed thickness slightly greater than the distance D to provide for protection of the electrical contacts. When a mating electrical device such as an electrical connector or other circuit member is mated to the electrical connector with its electrical contacts and its layer of compressible material, the layer of compressible material is compressed to a thickness less than the distance D, allowing the contacts to make a suitable electrical interconnection to the mating electrical device. The compressible material may be selected which has a force-to-compression plot which includes at least one inflection, defining a first region on one side of the inflection where a given increment of force provides a larger increment of compression and a second region on the other side of the
(Continued)

inflection where the same increment of compressive force provides a substantially smaller increment of compression. The compressible material can function to prevent damage to the movable electrical contacts from handling, packing, shipping, assembly, testing, connection and/or mating of the connector.

15 Claims, 12 Drawing Sheets

(51) Int. Cl.
    *H01R 12/73*     (2011.01)
    *H01R 12/71*     (2011.01)
    *H01R 13/24*     (2006.01)
    *H05K 3/28*     (2006.01)
    *H05K 3/40*     (2006.01)

(52) U.S. Cl.
    CPC ......... *H01R 13/2442* (2013.01); *H05K 3/285* (2013.01); *H01R 12/714* (2013.01); *H01R 13/2407* (2013.01); *H05K 3/281* (2013.01); *H05K 3/4015* (2013.01); *H05K 2201/015* (2013.01); *H05K 2201/0116* (2013.01); *H05K 2201/0133* (2013.01); *H05K 2201/0145* (2013.01); *H05K 2201/0162* (2013.01); *H05K 2201/10189* (2013.01); *H05K 2201/10265* (2013.01); *H05K 2201/2036* (2013.01); *Y10T 29/49208* (2015.01)

(56) References Cited

U.S. PATENT DOCUMENTS

| | | | |
|---|---|---|---|
| 3,212,049 A | 10/1965 | Mittler et al. |
| 3,543,587 A | 12/1970 | Kawada |
| 3,634,807 A | 1/1972 | Grobe et al. |
| 3,670,409 A | 6/1972 | Reimer |
| 3,850,500 A | 11/1974 | Cobaugh et al. |
| 4,087,146 A | 5/1978 | Hudson, Jr. |
| 4,175,810 A | 11/1979 | Holt et al. |
| 4,257,417 A | 3/1981 | Gibilisco |
| 4,344,430 A | 8/1982 | Astrove |
| 4,548,451 A | 10/1985 | Benarr et al. |
| 4,592,617 A | 6/1986 | Seidler |
| 4,657,336 A | 4/1987 | Johnson et al. |
| 4,734,053 A | 3/1988 | Imai |
| 4,790,777 A | 12/1988 | Iimori et al. |
| 4,893,172 A | 1/1990 | Matsumoto et al. |
| 4,944,690 A | 7/1990 | Imai |
| 4,960,407 A | 10/1990 | Cope |
| 4,998,885 A | 3/1991 | Beaman |
| 5,010,641 A | 4/1991 | Sisler |
| 5,053,083 A | 10/1991 | Sinton |
| 5,135,403 A | 8/1992 | Rinaldi |
| 5,139,427 A | 8/1992 | Boyd et al. |
| 5,148,266 A | 9/1992 | Khandros et al. |
| 5,152,695 A | 10/1992 | Grabbe et al. |
| 5,161,983 A | 11/1992 | Ohno et al. |
| 5,173,055 A | 12/1992 | Grabbe |
| 5,199,879 A | 4/1993 | Kohn et al. |
| 5,228,861 A | 7/1993 | Grabbe |
| 5,257,950 A | 11/1993 | Lenker et al. |
| 5,292,558 A | 3/1994 | Heller et al. |
| 5,299,939 A | 4/1994 | Walker et al. |
| 5,316,496 A | 5/1994 | Imai |
| 5,338,209 A | 8/1994 | Brooks et al. |
| 5,358,411 A | 10/1994 | Mroczkowski et al. |
| 5,366,380 A | 11/1994 | Reymond |
| 5,373,964 A | 12/1994 | Moore |
| 5,380,210 A | 1/1995 | Grabbe et al. |
| 5,409,200 A | 4/1995 | Zingher et al. |
| 5,423,687 A | 6/1995 | Laub |
| 5,468,655 A | 11/1995 | Greer |
| 5,483,741 A | 1/1996 | Akram et al. |
| 5,509,814 A | 4/1996 | Mosquera |
| 5,528,456 A | 6/1996 | Takahashi |
| 5,529,504 A | 6/1996 | Greenstein et al. |
| 5,530,288 A | 6/1996 | Stone |
| 5,532,612 A | 7/1996 | Liang |
| 5,562,487 A | 10/1996 | Ii et al. |
| 5,575,662 A | 11/1996 | Yamamoto et al. |
| 5,583,378 A | 12/1996 | Marrs et al. |
| 5,590,460 A | 1/1997 | DiStefano et al. |
| 5,593,903 A | 1/1997 | Beckenbaugh et al. |
| 5,629,837 A | 5/1997 | Barabi et al. |
| 5,632,631 A | 5/1997 | Fjelstad et al. |
| 5,634,821 A | 6/1997 | Crane |
| 5,654,231 A | 8/1997 | Liang et al. |
| 5,691,913 A | 11/1997 | Tsuchida et al. |
| 5,751,556 A | 5/1998 | Butler et al. |
| 5,759,047 A | 6/1998 | Brodsky et al. |
| 5,772,451 A | 6/1998 | Dozier, II et al. |
| 5,791,911 A | 8/1998 | Fasano et al. |
| 5,802,699 A | 9/1998 | Fjelstad et al. |
| 5,812,378 A | 9/1998 | Fjelstad et al. |
| 5,842,273 A | 12/1998 | Schar |
| 5,860,585 A | 1/1999 | Rutledge et al. |
| 5,896,038 A | 4/1999 | Budnaitis et al. |
| 5,903,059 A | 5/1999 | Bertin et al. |
| 5,906,498 A | 5/1999 | Nagafuji |
| 5,911,597 A | 6/1999 | Oshitani |
| 5,934,914 A | 8/1999 | Fjelstad et al. |
| 5,938,453 A | 8/1999 | Ichimura |
| 5,956,575 A | 9/1999 | Bertin et al. |
| 5,967,797 A | 10/1999 | Maldonado |
| 5,967,850 A | 10/1999 | Crane |
| 5,980,335 A | 11/1999 | Barbieri et al. |
| 5,981,870 A | 11/1999 | Barcley et al. |
| 5,984,704 A | 11/1999 | Hashiguchi |
| 5,989,994 A | 11/1999 | Khoury et al. |
| 5,993,247 A | 11/1999 | Kidd |
| 6,000,280 A | 12/1999 | Miller et al. |
| 6,019,611 A | 2/2000 | McHugh et al. |
| 6,027,366 A | 2/2000 | Mori et al. |
| 6,029,344 A | 2/2000 | Khandros et al. |
| 6,031,282 A | 2/2000 | Jones et al. |
| 6,032,356 A | 3/2000 | Eldridge et al. |
| 6,042,387 A | 3/2000 | Jonaidi |
| 6,044,548 A | 4/2000 | Distefano et al. |
| 6,056,572 A | 5/2000 | Matsumoto et al. |
| 6,063,640 A | 5/2000 | Mizukoshi et al. |
| 6,072,323 A | 6/2000 | Hembree et al. |
| 6,083,837 A | 7/2000 | Millet |
| 6,084,312 A | 7/2000 | Lee |
| 6,089,904 A | 7/2000 | Wu |
| 6,133,534 A | 10/2000 | Fukutomi et al. |
| 6,142,789 A | 11/2000 | Nolan et al. |
| 6,146,151 A | 11/2000 | Li |
| 6,152,771 A | 11/2000 | Juntwait |
| 6,156,484 A | 12/2000 | Bassous et al. |
| 6,170,808 B1 | 1/2001 | Kutschi |
| 6,181,144 B1 | 1/2001 | Hembree et al. |
| 6,184,699 B1 | 2/2001 | Smith et al. |
| 6,191,368 B1 | 2/2001 | Di Stefano et al. |
| 6,196,852 B1 | 3/2001 | Neumann et al. |
| 6,200,143 B1 | 3/2001 | Haba et al. |
| 6,203,347 B1 | 3/2001 | Crane, Jr. |
| 6,204,065 B1 | 3/2001 | Ochiai |
| 6,205,660 B1 | 3/2001 | Fjelstad et al. |
| 6,208,157 B1 | 3/2001 | Akram et al. |
| 6,218,848 B1 | 4/2001 | Hembree et al. |
| 6,220,869 B1 | 4/2001 | Grant et al. |
| 6,221,750 B1 | 4/2001 | Fjelstad |
| 6,224,392 B1 | 5/2001 | Fasano et al. |
| 6,250,933 B1 | 6/2001 | Khoury et al. |
| 6,255,727 B1 | 7/2001 | Khoury |
| 6,255,736 B1 | 7/2001 | Kaneko |
| 6,263,566 B1 | 7/2001 | Hembree et al. |
| 6,264,477 B1 | 7/2001 | Smith et al. |
| 6,293,806 B1 | 9/2001 | Yu |
| 6,293,808 B1 | 9/2001 | Ochiai |
| 6,297,164 B1 | 10/2001 | Khoury et al. |

(56) References Cited

U.S. PATENT DOCUMENTS

| | | |
|---|---|---|
| 6,298,552 B1 | 10/2001 | Li |
| 6,300,782 B1 | 10/2001 | Hembree et al. |
| 6,306,752 B1 | 10/2001 | DiStefano et al. |
| 6,315,616 B1 | 11/2001 | Hayashi |
| 6,329,604 B1 | 12/2001 | Koya |
| 6,332,801 B1 | 12/2001 | Watanbe |
| 6,335,210 B1 | 1/2002 | Farooq et al. |
| 6,336,269 B1 | 1/2002 | Eldridge et al. |
| 6,337,575 B1 | 1/2002 | Akram |
| 6,345,987 B1 | 2/2002 | Mori et al. |
| 6,352,436 B1 | 3/2002 | Howard |
| 6,361,328 B1 | 3/2002 | Gosselin |
| 6,373,267 B1 | 4/2002 | Hiroi |
| 6,374,487 B1 | 4/2002 | Haba et al. |
| 6,375,474 B1 | 4/2002 | Harper, Jr. et al. |
| 6,384,475 B1 | 5/2002 | Beroz et al. |
| 6,386,905 B1 | 5/2002 | Ito |
| 6,392,524 B1 | 5/2002 | Biegelsen et al. |
| 6,392,534 B1 | 5/2002 | Flick |
| 6,397,460 B1 | 6/2002 | Hembree |
| 6,399,900 B1 | 6/2002 | Khoury et al. |
| 6,402,526 B1 | 6/2002 | Schreiber et al. |
| 6,409,521 B1 | 6/2002 | Rathburn |
| 6,420,661 B1 | 7/2002 | Di Stefano et al. |
| 6,420,789 B1 | 7/2002 | Tay et al. |
| 6,420,884 B1 | 7/2002 | Khoury et al. |
| 6,428,328 B2 | 8/2002 | Haba et al. |
| 6,431,881 B1 | 8/2002 | Engbring et al. |
| 6,436,802 B1 | 8/2002 | Khoury |
| 6,437,591 B1 | 8/2002 | Farnworth et al. |
| 6,442,039 B1 | 8/2002 | Schreiber |
| D463,550 S | 9/2002 | Sherman |
| 6,447,305 B1 | 9/2002 | Roberts |
| 6,452,407 B2 | 9/2002 | Khoury et al. |
| 6,454,573 B2 | 9/2002 | Hayashi et al. |
| 6,461,892 B2 | 10/2002 | Beroz |
| 6,465,748 B2 | 10/2002 | Yamanashi et al. |
| 6,472,890 B2 | 10/2002 | Khoury et al. |
| 6,474,997 B1 | 11/2002 | Ochiai |
| 6,492,251 B1 | 12/2002 | Haba et al. |
| 6,497,581 B2 | 12/2002 | Slocum et al. |
| 6,517,362 B2 | 2/2003 | Hirai et al. |
| 6,520,778 B1 | 2/2003 | Eldridge et al. |
| 6,524,115 B1 | 2/2003 | Gates et al. |
| 6,532,654 B2 | 3/2003 | Guerin et al. |
| 6,551,112 B1 | 4/2003 | Li et al. |
| 6,558,187 B2 | 5/2003 | Aoki |
| 6,576,485 B2 | 6/2003 | Zhou et al. |
| 6,577,003 B1 | 6/2003 | Crane et al. |
| 6,580,031 B2 | 6/2003 | Chung |
| 6,604,950 B2 | 8/2003 | Maldonado et al. |
| 6,612,861 B2 | 9/2003 | Khoury et al. |
| 6,616,966 B2 | 9/2003 | Mathieu et al. |
| 6,622,380 B1 | 9/2003 | Grigg |
| 6,627,092 B2 | 9/2003 | Clements et al. |
| 6,640,432 B1 | 11/2003 | Mathieu et al. |
| 6,661,247 B2 | 12/2003 | Maruyama et al. |
| 6,663,399 B2 | 12/2003 | Ali et al. |
| 6,664,131 B2 | 12/2003 | Jackson |
| 6,669,489 B1 | 12/2003 | Dozier, II et al. |
| 6,671,947 B2 | 1/2004 | Bohr |
| 6,672,879 B2 | 1/2004 | Neidich et al. |
| 6,677,245 B2 | 1/2004 | Zhou et al. |
| 6,692,263 B2 | 2/2004 | Villain et al. |
| 6,692,265 B2 | 2/2004 | Kung et al. |
| 6,700,072 B2 | 3/2004 | Distefano et al. |
| 6,701,612 B2 | 3/2004 | Khandros et al. |
| 6,719,569 B2 | 4/2004 | Ochiai |
| 6,730,134 B2 | 5/2004 | Neidich |
| 6,733,326 B2 | 5/2004 | Lee |
| 6,736,664 B2 | 5/2004 | Ueda et al. |
| 6,736,665 B2 | 5/2004 | Zhou et al. |
| 6,749,459 B2 | 6/2004 | Urbaniak et al. |
| 6,750,136 B2 | 6/2004 | Zhou et al. |
| 6,750,551 B1 | 6/2004 | Frutschy et al. |
| 6,759,257 B2 | 7/2004 | McCormack et al. |
| 6,763,581 B2 | 7/2004 | Hirai et al. |
| 6,791,171 B2 | 9/2004 | Mok et al. |
| 6,814,584 B2 | 11/2004 | Zaderej |
| 6,814,587 B2 | 11/2004 | Ma |
| 6,815,961 B2 | 11/2004 | Mok et al. |
| 6,821,129 B2 | 11/2004 | Tsuchiya |
| 6,843,659 B2 | 1/2005 | Liao et al. |
| 6,847,101 B2 | 1/2005 | Fjelstad et al. |
| 6,848,173 B2 | 2/2005 | Fjelstad et al. |
| 6,848,929 B2 | 2/2005 | Ma |
| 6,853,210 B1 | 2/2005 | Farnworth et al. |
| 6,855,002 B2 | 2/2005 | Chiu |
| 6,857,880 B2 | 2/2005 | Ohtsuki et al. |
| 6,861,747 B2 | 3/2005 | Miyazaki et al. |
| 6,869,290 B2 | 3/2005 | Brown et al. |
| 6,869,307 B2 | 3/2005 | Endo |
| 6,881,070 B2 | 4/2005 | Chiang |
| 6,887,085 B2 | 5/2005 | Hirai |
| 6,898,580 B1 | 5/2005 | Curran et al. |
| 6,898,773 B1 | 5/2005 | Teig et al. |
| 6,902,425 B2 | 6/2005 | Huang |
| 6,916,181 B2 | 7/2005 | Brown et al. |
| 6,920,689 B2 | 7/2005 | Khandros et al. |
| 6,923,656 B2 | 8/2005 | Novotny et al. |
| 6,926,536 B2 | 8/2005 | Ochiai |
| 6,939,143 B2 | 9/2005 | Rathburn |
| 6,957,963 B2 | 10/2005 | Rathburn |
| 6,960,924 B2 | 11/2005 | Akram |
| 6,965,245 B2 | 11/2005 | Kister et al. |
| 6,976,888 B2 | 12/2005 | Shirai et al. |
| 6,980,017 B1 | 12/2005 | Farnworth et al. |
| 6,995,557 B2 | 2/2006 | Goldfine et al. |
| 6,995,577 B2 | 2/2006 | Farnworth et al. |
| 7,001,208 B2 | 2/2006 | Huang |
| 7,002,362 B2 | 2/2006 | Farnworth et al. |
| 7,004,775 B1 | 2/2006 | Sakurai et al. |
| 7,009,413 B1 | 3/2006 | Alghouli |
| 7,021,941 B1 | 4/2006 | Chuang et al. |
| 7,021,970 B2 | 4/2006 | Ozai |
| 7,025,601 B2 | 4/2006 | Dittmann |
| D521,455 S | 5/2006 | Radza |
| D521,940 S | 5/2006 | Radza |
| 7,048,548 B2 | 5/2006 | Mathieu et al. |
| 7,053,482 B2 | 5/2006 | Cho |
| D522,461 S | 6/2006 | Radza |
| D522,972 S | 6/2006 | Long et al. |
| 7,056,131 B1 | 6/2006 | Williams |
| 7,063,560 B2 | 6/2006 | Asao |
| D524,756 S | 7/2006 | Radza |
| 7,070,419 B2 | 7/2006 | Brown et al. |
| 7,074,074 B2 | 7/2006 | Zhang et al. |
| 7,083,425 B2 | 8/2006 | Chong et al. |
| 7,086,869 B1 | 8/2006 | Dangler et al. |
| 7,090,503 B2 | 8/2006 | Dittmann |
| 7,097,496 B2 | 8/2006 | Zhang et al. |
| 7,112,089 B1 | 9/2006 | Liu et al. |
| 7,113,408 B2 | 9/2006 | Brown et al. |
| 7,114,961 B2 | 10/2006 | Williams |
| 7,140,883 B2 | 11/2006 | Khandros et al. |
| 7,156,706 B2 | 1/2007 | Brown et al. |
| 7,189,090 B2 | 3/2007 | Aizawa et al. |
| 7,210,942 B2 | 5/2007 | Uchida et al. |
| 7,238,044 B2 | 7/2007 | Uchida et al. |
| 7,240,425 B2 | 7/2007 | Khilchenko et al. |
| 7,244,125 B2 | 7/2007 | Brown et al. |
| 7,244,195 B1 | 7/2007 | Yamagishi et al. |
| 7,245,137 B2 | 7/2007 | Eldridge et al. |
| 7,252,540 B2 | 8/2007 | Tanaka |
| 7,261,569 B2 | 8/2007 | Uchida et al. |
| 7,261,595 B2 | 8/2007 | Shino |
| 7,263,771 B2 | 9/2007 | Ochiai |
| 7,285,015 B2 | 10/2007 | Helbok et al. |
| 7,347,698 B2 | 3/2008 | Dittmann |
| 7,354,276 B2 | 4/2008 | Dittmann |
| 7,357,644 B2 | 4/2008 | Dittmann |
| 7,371,073 B2 | 5/2008 | Williams |
| 7,383,632 B2 | 6/2008 | Dittmann |
| 7,540,081 B2 | 6/2009 | Kumar et al. |

(56) References Cited

U.S. PATENT DOCUMENTS

| | | |
|---|---|---|
| 7,552,530 B2 | 6/2009 | Mueller |
| 7,597,561 B2 | 10/2009 | Radza et al. |
| 7,621,756 B2 | 11/2009 | Dittmann |
| 7,625,220 B2 | 12/2009 | Dittmann et al. |
| 7,628,617 B2 | 12/2009 | Brown et al. |
| 7,645,147 B2 | 1/2010 | Dittmann |
| 7,758,351 B2 | 7/2010 | Brown et al. |
| 7,891,988 B2 | 2/2011 | Dittmann et al. |
| 7,989,945 B2 | 8/2011 | Williams et al. |
| 8,109,769 B1 * | 2/2012 | Ismail et al. ................ 439/66 |
| 2001/0001080 A1 | 5/2001 | Eldridge et al. |
| 2001/0024890 A1 | 9/2001 | Maruyama et al. |
| 2002/0006744 A1 | 1/2002 | Tashiro |
| 2002/0008966 A1 | 1/2002 | Fjelstad et al. |
| 2002/0011859 A1 | 1/2002 | Smith et al. |
| 2002/0055282 A1 | 5/2002 | Eldridge et al. |
| 2002/0055289 A1 | 5/2002 | Murakami et al. |
| 2002/0058356 A1 | 5/2002 | Oya |
| 2002/0079120 A1 | 6/2002 | Eskildsen et al. |
| 2002/0117330 A1 | 8/2002 | Eldridge et al. |
| 2002/0129866 A1 | 9/2002 | Czebatul et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0178331 A1 | 11/2002 | Beardsley et al. |
| 2002/0179331 A1 | 12/2002 | Brodsky et al. |
| 2003/0000739 A1 | 1/2003 | Frutschy et al. |
| 2003/0003779 A1 | 1/2003 | Rathburn |
| 2003/0008548 A1 | 1/2003 | Ueda et al. |
| 2003/0013341 A1 | 1/2003 | Urbaniak et al. |
| 2003/0022503 A1 | 1/2003 | Clements et al. |
| 2003/0029907 A1 | 2/2003 | Neidich et al. |
| 2003/0035277 A1 | 2/2003 | Saputro et al. |
| 2003/0049951 A1 | 3/2003 | Eldridge et al. |
| 2003/0064635 A1 | 4/2003 | Ochiai |
| 2003/0089936 A1 | 5/2003 | McCormack et al. |
| 2003/0092293 A1 | 5/2003 | Ohtsuki et al. |
| 2003/0096512 A1 | 5/2003 | Cornell |
| 2003/0099097 A1 | 5/2003 | Mok et al. |
| 2003/0129866 A1 | 7/2003 | Romano et al. |
| 2003/0147197 A1 | 8/2003 | Uriu et al. |
| 2003/0194832 A1 | 10/2003 | Lopata et al. |
| 2004/0029411 A1 | 2/2004 | Rathburn |
| 2004/0033717 A1 | 2/2004 | Peng |
| 2004/0072456 A1 | 4/2004 | Dozier et al. |
| 2004/0072467 A1 | 4/2004 | Jordan et al. |
| 2004/0118603 A1 | 6/2004 | Chambers |
| 2004/0127073 A1 | 7/2004 | Ochiai |
| 2004/0157476 A1 * | 8/2004 | Maldonado et al. .......... 439/66 |
| 2004/0229506 A1 | 11/2004 | Asao |
| 2005/0020125 A1 | 1/2005 | Huang |
| 2005/0042896 A1 | 2/2005 | Huang |
| 2005/0088193 A1 | 4/2005 | Haga |
| 2005/0099193 A1 | 5/2005 | Burgess |
| 2005/0099763 A1 | 5/2005 | Rathburn |
| 2005/0142900 A1 | 6/2005 | Boggs et al. |
| 2005/0161797 A1 | 7/2005 | Miller |
| 2005/0164527 A1 | 7/2005 | Radza et al. |
| 2005/0167816 A1 | 8/2005 | Khandros et al. |
| 2005/0208788 A1 | 9/2005 | Dittmann |
| 2005/0287828 A1 | 12/2005 | Stone et al. |
| 2006/0028222 A1 | 2/2006 | Farnworth et al. |
| 2006/0113107 A1 | 6/2006 | Williams |
| 2006/0121756 A1 | 6/2006 | Kuo et al. |
| 2006/0128207 A1 | 6/2006 | Zhang et al. |
| 2006/0173425 A1 | 8/2006 | Meierhoefer |
| 2006/0189179 A1 | 8/2006 | Dittmann et al. |
| 2006/0228933 A1 | 10/2006 | Liu et al. |
| 2006/0276059 A1 | 12/2006 | Dittmann et al. |
| 2006/0281361 A1 | 12/2006 | Uchida et al. |
| 2007/0050738 A1 | 3/2007 | Dittmann |
| 2007/0054515 A1 | 3/2007 | Williams |
| 2007/0054544 A1 | 3/2007 | Hirata |
| 2007/0054545 A1 | 3/2007 | Takahira |
| 2007/0105433 A1 | 5/2007 | Shioda et al. |
| 2007/0123074 A1 | 5/2007 | Nishimura |
| 2007/0134949 A1 | 6/2007 | Dittmann |
| 2007/0141863 A1 | 6/2007 | Williams |
| 2007/0178751 A1 | 8/2007 | Yamamoto |
| 2007/0218710 A1 | 9/2007 | Brown et al. |
| 2007/0259539 A1 | 11/2007 | Brown et al. |
| 2007/0269997 A1 | 11/2007 | Eldridge et al. |
| 2007/0275572 A1 | 11/2007 | Williams et al. |
| 2007/0275579 A1 | 11/2007 | Si et al. |
| 2008/0045076 A1 | 2/2008 | Dittmann et al. |
| 2008/0050958 A1 | 2/2008 | Hashiguchi et al. |
| 2008/0076282 A1 | 3/2008 | Yamaji et al. |
| 2008/0134502 A1 | 6/2008 | Dittmann |
| 2009/0193654 A1 | 8/2009 | Dittmann |
| 2010/0055941 A1 | 3/2010 | Dittmann et al. |
| 2010/0075514 A1 | 3/2010 | Williams |
| 2010/0167561 A1 | 7/2010 | Brown et al. |

FOREIGN PATENT DOCUMENTS

| | | |
|---|---|---|
| EP | 1005086 A2 | 5/2000 |
| EP | 1280241 A1 | 1/2003 |
| EP | 692823 B1 | 2/2003 |
| EP | 1005086 B1 | 9/2003 |
| EP | 839321 B1 | 1/2006 |
| JP | 2000-114433 | 4/2000 |
| JP | 2001-203435 A2 | 7/2001 |
| JP | 2005158653 A1 | 11/2003 |
| WO | 96/02068 A1 | 1/1996 |
| WO | 97/43653 A1 | 11/1997 |
| WO | 97/44859 A1 | 11/1997 |
| WO | 02/13253 A1 | 2/2002 |
| WO | 2004/112451 A1 | 12/2004 |
| WO | 2005/034296 A1 | 4/2005 |
| WO | 2005/036940 A1 | 4/2005 |
| WO | 2005/067361 A1 | 7/2005 |
| WO | 2005/091996 A2 | 10/2005 |
| WO | 2007/056169 A2 | 5/2007 |
| WO | 2007/056169 A3 | 10/2007 |
| WO | 2007/124113 A2 | 11/2007 |
| WO | 2007/143115 A2 | 12/2007 |
| WO | 2007/143115 A3 | 10/2008 |
| WO | 2008/131097 A2 | 10/2008 |
| WO | 2008/131097 A3 | 1/2009 |
| WO | 2007/124113 A3 | 4/2009 |

OTHER PUBLICATIONS

Guerin, et al., "Spring Land Grid Array Development: an Integrated Demountable Solution", www.chips.ibm.com/news, MicroNews Third Quarter 2001, pp. 22-24.

Kromann, et al., "Motorola's PowerPC 603 and PowerPC 604 RISC Microprocessor: the C4/Ceramic-ball-grid Array Interconnect Technology", Motorola Advanced Packaging Technology, Motorola Inc.,(1996), 10 Pgs.

Mahajan, et al., "Emerging Directions for packaging Technologies", Intel Technology Journal, V. 6, Issue 02, (May 16, 2002), pp. 62-75.

Suppa, "Via Hole Plugging of SBU PCBs: Trends, Possibilities, Application and Processing as Well as Limitations", Report No. 154 E; Lackwerke Peters GmbH Speziallacke fur die Elekronik; LP023007 E-O; REF 154e.0, Supplemented and revised version of the paper presented at the DVS/GMM Convention regarding the topic "Electronic Assemblies—Build-up and Process Technology.",(Feb. 6 and 7, 2002), 19 pgs.

* cited by examiner

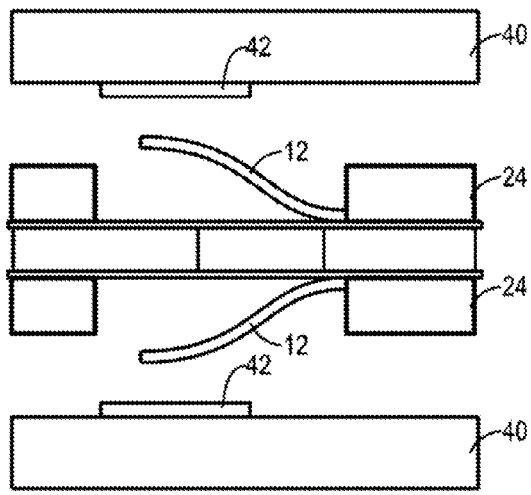
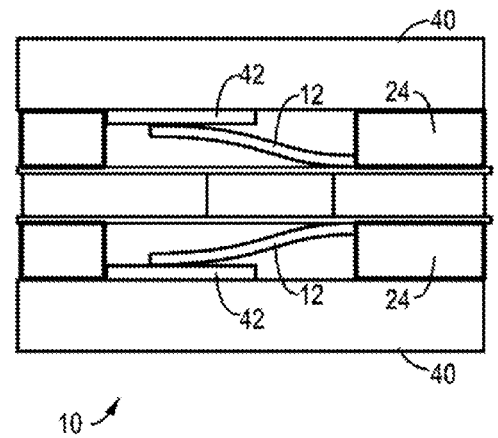
FIG. 3a  FIG. 3b
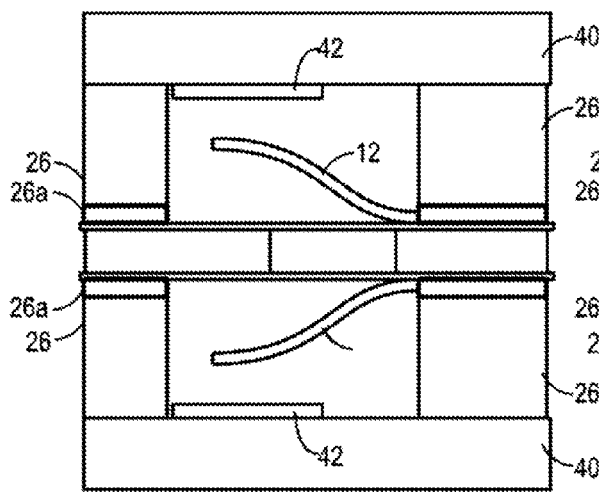
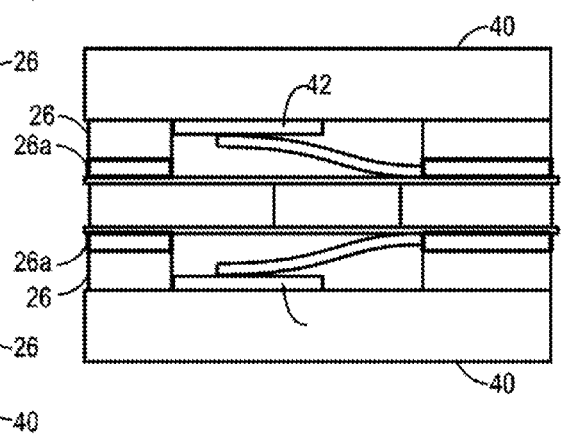
FIG. 3c  FIG. 3d
FIG. 3

ELECTRICAL CONNECTOR WITH ELECTRICAL CONTACTS PROTECTED BY A LAYER OF COMPRESSIBLE MATERIAL AND METHOD OF MAKING IT

CROSS REFERENCE TO RELATED PATENTS

The present invention is related to the inventions described in the following United States Patents and Patent Applications:

U.S. Pat. No. 7,371,073 entitled "Contact Grid Array", issued May 13, 2008, to inventor John David Williams and assigned to Neoconix, Inc., the assignee of the present patent; this patent is sometimes referred to herein as the "Contact Array Patent".

U.S. Pat. No. 7,758,351 entitled "Method and System for Batch Forming of Spring Elements" issued Jul. 20, 2010, to inventors Dirk D. Brown et al. and also assigned to Neoconix, Inc. This patent is sometimes referred to herein as the "Batch Forming Patent".

U.S. patent application Ser. No. 13/310,647 entitled "Electrical Connector and Method of Making It", filed Dec. 2, 2011 by David Noel Light and assigned to the assignee of the present invention. This patent is sometimes referred to herein as the "Filled Vias Patent".

The teachings of each of the foregoing patents and patent applications are specifically incorporated herein by reference.

BACKGROUND OF THE INVENTION

Field of the Invention

The present invention relates to electrical connectors, and has particular relevance to electrical connectors having electrical contacts which are small and/or fragile and/or subject to damage and protection for the contacts and/or the electrical interconnection is desired. The present invention thus relates to such electrical connectors as zero-insertion-force (ZIF) connectors, connectors with surface emanating springs such as Neoconix PCBeam™ connectors, pogo pin connectors and sockets, cantilever beam connectors, spiral spring connectors, land grid array connectors, and two-piece stacked ("mezzanine") board-to-board connectors, as well as connectors for other interconnection applications. It has particular relevance to those applications in which a compressive force is applied to actuate an electrical and mechanical interconnection between two electronic components.

Background Art

Various electrical connectors are known in the art such as ZIF (zero insertion force) electrical connectors, connectors with surface-emanating springs (such as the PC-Beam electrical connectors from Neoconix, the assignee of the present invention), two-piece stacked board-to-board connectors, and other similar electrical connectors. These electrical connectors provide electrical interconnection between electronic components within an electronic system, typically when a compressive force is applied between the connector and one or more circuit members to provide electrical and mechanical interconnections between two circuit members or electronic components, or between the connector and one other electronic component. Electronic components, as defined here, can include circuit members such as printed circuit boards, flexible printed circuits, modules, integrated circuits, integrated circuit package substrates, memory modules, multichip modules, mother boards, daughter cards, main logic boards, memory boards, passive components, active devices, sockets, connectors, and the like.

In one typical application of an electrical connector, for interconnection of two circuit members, such as interconnection of a first rigid printed circuit board to a second rigid printed circuit board or to a first flexible printed circuit, movable and electrically conductive spring elements of an electrical connector serve as electrical contacts, and are actuated by compressing them primarily in a vertical (Z) direction (perpendicular to the mating surface of the circuit member) to electrically and mechanically connect them to electrically conductive circuit paths (e.g. traces, pads, circuits, or other spring elements) on the circuit members, whereby when actuated, the spring elements provide an electrical interconnection to the electrically conductive circuit paths.

In such a connector system, the contact springs may at times be exposed to external forces which can cause damage, such as during handling, testing, inspection, and assembly into an electronic device. For this reason, in some connectors such as two piece 'mezzanine connectors' or ZIF connectors with molded plastic housings, the contact springs may be recessed into the housings. In other words, they may not protrude out from the highest or outermost surfaces of the connector. However, because these housings are highly rigid, this type of protective structure adds to the thickness of the connector, which can be a detriment in miniaturized electronic systems such as mobile consumer products. This type of design may also require a portion of one or both of the mating members to protrude into the recess in the connector in order to make electrical connection, such as in the case of a stacked board to board connector with a header and a socket or receptacle, and the case of a flexible printed circuit connecting to a ZIF connector mounted on a printed circuit board. In some of the two piece stacked connectors, the contacts in the receptacle are recessed and hence somewhat protected, whereas the contacts in the header are not recessed and hence may not be as effectively protected from damage. In a connector with surface emanating contacts or other non-recessed contacts, significant over-compression, upward displacement, or lateral displacement of the electrical contacts can cause damage to the electrical contacts. Some electrical contacts are susceptible to damage such as scratching or contamination, or to plastic yielding due to excessive bending, twisting, lifting, over-compression or other rough handling. In some cases, such damage reduces the effectiveness of the electrical contacts; in severe cases, the electrical contacts may become unusable or their performance compromised. As connectors become more miniaturized to allow smaller electronic systems, the contact springs will likely be required to become smaller as well, and as such they may become more fragile.

Further, in some applications moisture or liquids may be present in the vicinity of the electrical connector, during functional use of the connector in the ultimate application. It is desirable to avoid fluid or moisture ingress at the point where the electrical interconnection occurs (the interfaces between the electrical spring contacts of the connector and the mating conductive circuits on the mating circuit member) to avoid degradation of the integrity of the interconnection from oxidation or other moisture-induced damage to the contact or mating conductive circuit element. Further, when an electronic device, such as a mobile phone, is powered on, and water or other conductive liquid penetrates to the electrical connections of a connector, a short circuit can occur which can interrupt the function of the device, and/or may cause permanent damage to critical components of the system.

Other limitations and disadvantages of the present electrical connectors will be apparent to someone of ordinary skill in the art in view of the description of the present invention which follows in this document.

SUMMARY OF THE INVENTION

The present invention is an electrical connector in which a layer of compressible material is positioned around (or adjacent to) the electrical contacts to protect the electrical contacts from damage or degradation and to assist in their functioning in an electronic device.

This layer of compressible material can provide significant protection in some cases from mechanical damage of the electrical contacts in some applications.

In some cases, it is beneficial to the functioning of this invention that the compressible material is taller in height than the electrical contacts (which may be spring contact elements emanating from a surface of the connector), so that the contacts are recessed below the surface of the compressible material in its uncompressed state. This configuration can prevent the lateral forces that may be most likely to impart damage to the connectors. It can also prevent or reduce the likelihood of upward or lifting forces on spring contacts such as cantilever beams, and can prevent or reduce the likelihood of the electrical contacts being marred or scratched or contaminated by other objects during fabrication, handling, packing, shipping, assembly, and use. The compressible nature of the material helps to absorb and dissipate energy from impacts, blows, vibrations, shocks, or other potentially deleterious forces that can damage the connector. It also allows the material to be compressed to a reduced thickness when compressive forces are applied to actuate the connector, such that the material doesn't interfere with the functioning of the spring contacts electrically and mechanically.

In some cases, the compressible material may be located on a ridge or protrusion or other feature which extends outwardly from the surface from which the spring contact elements emanate or protrude, so that the compressible material can be shorter in actual thickness than the height of the contacts, but can still protrude from the connector further than the spring contact elements do, and hence the result is contacts that are recessed below the outer surface of the compressible material.

This layer of compressible material may also provide some resistance to moisture or fluid ingress in the region of the electrical interconnection between the electrical contacts on one member and the conductive electrical circuit elements on a mating member in some applications, when it is significantly compressed and when at least a portion of it fully surrounds the electrical contacts in the connector.

A layer of compressible material can also provide a mechanical "cushion" to absorb some of the impact forces and buffer the electrical contacts from damage from mechanical impacts to the electrical contacts, both during manufacturing and assembly and in the mating process or during repair or rework. This compressible material can also provide shock absorption in its compressed state, which helps dampen the impact of shock, drop, or vibration of the electronic device in which the connector is used, to reduce the possibility of a transient interruption to the electrical continuity through the connector and to reduce wear of the electrical contacts, as well as preventing other damage such as cracking of the housing or of soldered interconnections, in the case of surface mount soldered connectors.

If desired, the compressible material may be chosen from a group of materials for which a graph plotting compression force versus displacement (or compression ratio, or percent compression) includes a significant inflection, separating a first region of generally greater incremental compression for a given amount of incremental force (and often with an approximately linear compression amount per unit force) from a second, sometimes non-linear region where the same increment of force increase provides significantly less incremental compression. This inflection in the plot of force versus compression separates a region where a given increment force provides a significant amount of compression of the material from a region on the other side of the inflection where the same increment of force produces a relatively small additional compression. Materials with this combination of characteristics are frequently foam materials. It is possible that the greater initial displacement per unit of force applied is due to the fact that at low percentage displacement, foam materials have a high percentage of their volume made up of air or other gases, or in some cases liquids. In this regime, the resistance to displacement may be primarily due to the expulsion and/or compression of air (and/or other gases or fluids) from the layer of compressible material initially. Likewise, the relatively smaller amount of displacement per unit of force applied in the region past the inflection may result from the reduced amount of air (and/or other fluids)—i.e. the non-polymer components—remaining in the layer of compressible material after the force to get to the inflection has been applied and has resulted in the expulsion of a high percentage of the non-polymer components. This may be because once most of the gas or liquid filled cells in the compressive material are emptied, further compressive displacement of the material requires compression of the polymer which makes up the primary structure of the foam and which now comprises a high percentage of the remaining volume, and this material requires a much higher compression force to displace it than the force required to expel or compress air or other gases from pores in the material. These force versus displacement graphs show that certain compressible materials, such as foams, can initially have very low compression forces but become effectively incompressible when the percentage of compression is high, when considered in the realm of forces that can be applied to compress a connector in an electronic device. Other, non-foam materials may also have suitable properties as compressible materials for use in this invention, including some elastomers.

In order for the compressible material to not interfere with the electrical function of the electrical connector, it is generally advantageous to the functioning of this invention that the compressible material have openings for the electrical contacts, so that the electrical contact is not impeded from making electrical and mechanical contact to a mating circuit member directly. There may be a separate opening in a sheet or layer or film of the compressible material for each individual electrical contact, or other configurations may be possible where more than one contact resides in an opening, or where all of the contacts reside in a single opening. In the latter case, the compressible material may reside along the entire perimeter of the connector, or possibly along only some of the edges or with interruptions.

Also, in some applications, movable electrical contacts are positioned to project a defined average distance D above a substrate of an electrical connector on which the movable electrical contacts are mounted. Such movable contacts may emanate from the surface of the substrate, or from within or beneath the surface of a substrate, to a height D above the substrate surface. Such contacts may emanate from one or both sides of a substrate, and if from both sides, may be interconnected from one side to the other to allow electrical current to flow from a given contact on one side of the substrate to the other side of the substrate. If desired, the thickness of the compressible material may be chosen so that it is greater than or equal to the defined distance D when the layer of compressible material is uncompressed. Alternatively, if the compressible material is mounted on a surface above the surface from which the contact height D is measured, the thickness of the compressible material may be less than the contact height D, but still sit taller than the contacts when uncompressed. When the electrical connector is positioned on, aligned to, and compressed onto a mating circuit member, the layer of compressible material is compressed to a thickness such that its upper surface is coplanar with the uncompressed contact height D, and then is further compressed in concert with the electrical contact to a thickness significantly less than the distance D. In these configurations, the electrical contacts are positioned within the compressible material when not compressed (below the top surface of the layer of compressible material) and may be coplanar with, or project slightly above or in some cases even be recessed slightly below the layer of compressible material when that layer is compressed during mating, so that the electrical contacts may form electrical connections at or slightly above or slightly below the layer of compressed material, depending on the configuration of the mating conductive circuit elements on the mating circuit member. In some instances, if the electrical contacts are mating to circuit pads or traces on a mating circuit member such as a printed circuit board, whereby the pads or traces protrude above the surface of that circuit element, the compressed contact height may be less than the compressed thickness of the compressible material. In this instance, the mating pad or trace may protrude into the opening in the compressible material that is defined for one or more of the contact springs, hence compressing the contact spring below the surface of the compressible material, which itself may be making contact with the substrate of the circuit member from which the mating pad or trace protrudes slightly. In another instance, a mating circuit member such as a printed circuit board or a flexible printed circuit may have a soldermask or coverlayer surrounding the mating circuit elements (e.g. pads or lands) which stands taller than the mating circuit elements. In this instance, the compressible material on the connector will be compressed to a height lower than the height of the spring contact elements when the connector is fully actuated.

Other advantages of the present invention will be apparent to a person of ordinary skill in the art in view of the following description of the preferred embodiment and the accompanying drawings.

BRIEF DESCRIPTION OF THE DRAWINGS

FIG. 3 is four cutaway side views (labeled FIGS. 3a, 3b, 3c and 3d) showing the electrical contacts of only one surface of the connectors of FIGS. 1 and 2 mating with another connector (such as a circuit board with electrical circuit pads), showing the initial position of the connector of FIG. 1 in FIG. 3a, the mated position of the connector of FIG. 1 in FIG. 3b, the initial position of the connector of FIG. 2 in FIG. 3c and the mated position of the connector of FIG. 2 in FIG. 3d;

FIG. 7 is a perspective view of one embodiment of a layer or sheet of compressible material of the type shown in FIG. 2 while

FIG. 14a shows the prior art connector and FIG. 14b shows that connector with a layer of compressible material of the present invention.

DETAILED DESCRIPTION OF THE PREFERRED EMBODIMENT

Figure 1:
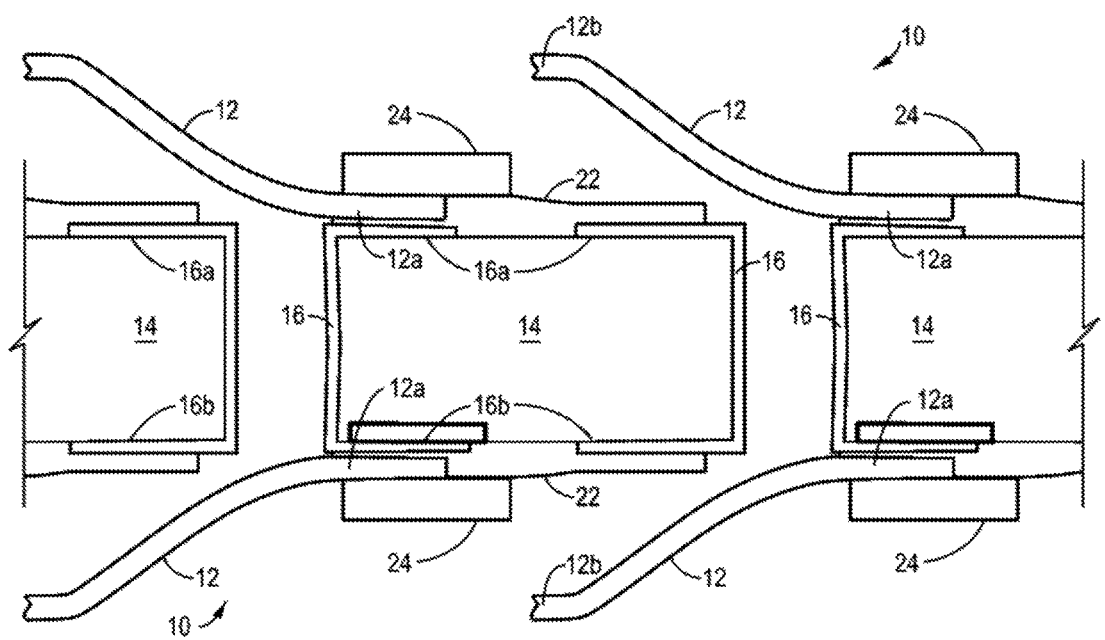
FIG. 1 is a cross sectional (cutaway) view of a portion of an electrical connector of the prior art.

FIG. 1 shows, in a cross-sectional or cutaway view, an electrical connector (which may be an interposer, as in the example depicted in this view) 10 of the prior art with a plurality of electrical contacts 12 arranged in an array of electrical contacts (only part of which array is depicted in this view). The electrical connector 10 includes a non-conductive or insulating substrate 14 with conductive vias 16 extending therethrough from an upper surface 18 of the substrate 14 to a lower surface 20 of the substrate 14. (Of course, "upper" and "lower" surfaces refer to the orientation of the connector 10 as shown in the present illustration of FIG. 1; the electrical connector 10 and the electrical contacts 12 can generally be mounted in any orientation as desired, including vertical mountings, if the application requires it, and electrical contacts and electrical connectors originally mounted in one orientation might be moved to a different orientation, if desired.) One such electrical connector (or interposer) 10 is shown in the Contact Array Patent referred to above, but the present invention is not limited to use in this structure, and other electrical connectors could use the present invention to advantage. The electrical contact 12 has a base portion 12a which is mounted to the substrate 14 and a cantilevered arm with a curved or curvilinear shape having a distal end 12b which protrudes above the surface of the substrate on which the contact is mounted. Multiple electrical contacts 12 can be formed into their desirable three-dimensional shape simultaneously using the methods taught in the Batch Forming Patent cited above.

The conductive vias 16 are formed from an electrically conductive material which may be electro-chemically or otherwise deposited in place and include a portion 16a which extends along the upper surface 18 and a portion 16*b* which extends along the lower surface 20. In this way, a first electrical contact on the lower surface 20 may be electrically coupled to a second electrical contact on the upper surface 18. The electrical coupling may be created by electroless or electrolytic plating, or by other means of depositing conductive layers. The electrical coupling may also be created by metal joining, such as by soldering or other electrical bonding means such as electrically conductive adhesives. The conductive vias 16 may be filled with an insulating or conductive material for protection of the conductive material, if desired, as described in the Filled Vias Patent referred to above and are in electrical conduction with a portion 16*a* of electrically-conductive material on the upper surface 18 and a portion 16*b* of electrically-conductive material on the lower surface 20 of the substrate 14.

A layer of adhesive material 22 may secure the electrical contact 12 to the substrate 14 and the portion 16*a* or 16*b* of the electrically-conductive material. An optional coverlay 24 also shown, where the coverlay 24 is a layer of non-conductive material which serves to protect the mechanical and electrical connection of the electrical contact 12 to the conductive material 16*a*. This coverlay 24 is typically a thin layer of insulating material (such as a polyimide film) with a thickness of 0.025 mm to 0.2 mm and more typically from 0.025 mm to 0.125 mm, and is generally rigid and unyielding (i.e., not compressible)—a typical compressive modulus of 2.5 GPa and a compressive yield force of 150 GPa. The base portion 12*a* of the electrical contact 12 often is positioned under a portion of the coverlay 24 and the cantilevered beam of the electrical contact (its distal end 12*b*) is displaced outwardly from the bottom plane of the coverlay 24 through an opening in the coverlay 24 (not shown in this view).

The coverlay 24 may also be secured to the substrate and held in the desired position using a layer of adhesive. Such an adhesive is often a layer of acrylic adhesive which is quite thin due to compression during the lamination process used to attach it in which the adhesive flows and conforms to any surface topography on the connector surface on which it is being mounted, and is fully cured so it also becomes relatively incompressible. Such a coverlay 24 and its adhesive provide a hard compression stop for the spring contact elements of the electrical connector when mated to a mating circuit element, at a level proportional to the thickness of the coverlay 24. The coverlay as described may typically have openings in which the contacts are located. This hard compression stop can prevent over-compression of the electrical contacts 12 such that they are not damaged and do not plastically yield during repeated compression cycles, since the contacts when compressed can recede into the opening in the coverlay and hence avoid being fully compressed. However, the distal ends 12*b* of an electrical contact 12 (such as the springs of a PCBeam connector or other functionally similar electrical contacts of a similar electrical connector, or the spring elements of electrical sockets or 'pogo pin' connectors, or other types of connectors) may be damaged if not handled properly during connector manufacturing, testing and inspection, and packing and shipping as well as during handling and assembly and actuation of the electrical connector into a circuit element and/or an electronic device. In addition, when a connector is implemented in an electronic device, it is potentially susceptible to water ingress from external sources, and subsequent shorting, corrosion, or other damage to the connector and/or the system can occur. A typical, incompressible coverlay does not effectively prevent or slow water ingress since the hard surface can not readily conform to surface topography of the mating circuit member's surface, and hence cannot effectively seal that interface from moisture or liquids.

Figure 2:
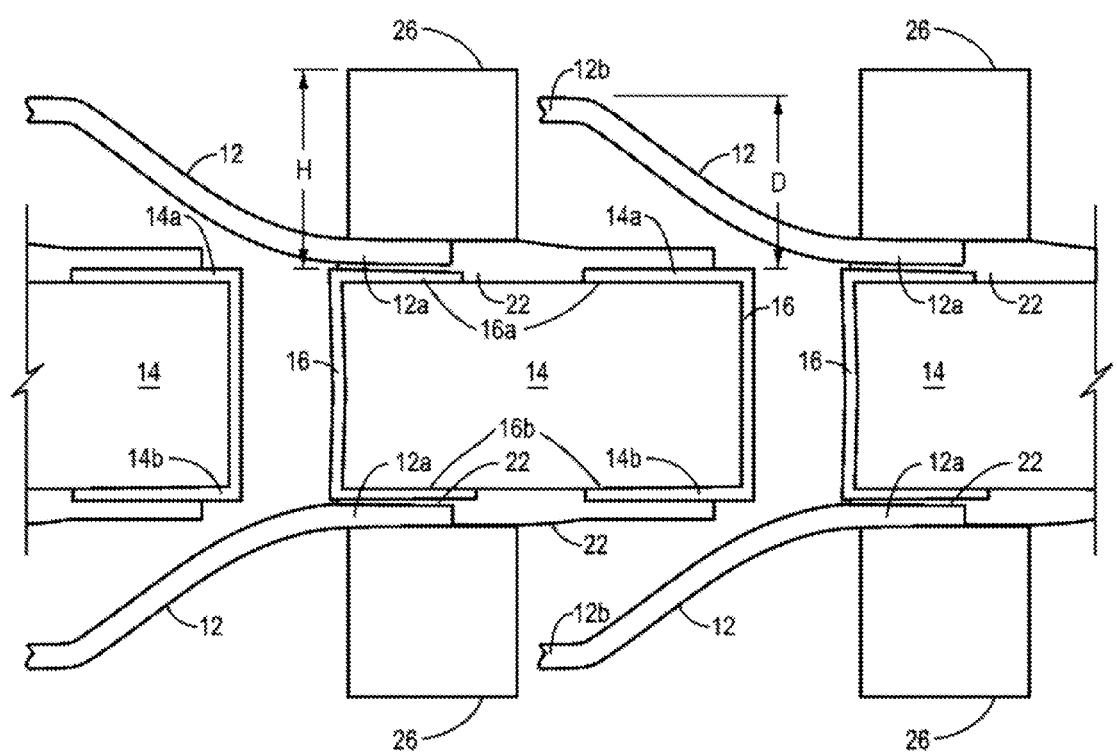
FIG. 2 is a cross sectional (cutaway) view of a portion of an electrical connector similar to that shown in FIG. 1, but with the addition of a layer of compressible material.

FIG. 2 is a cutaway or cross sectional view of an improved electrical connector 10' including elements of the present invention. Similar to the prior art electrical connector 10 of FIG. 1, this improved electrical connector 10' includes electrical contacts 12 carried on an insulating substrate 14 with conductive vias 16 extending between an upper surface 18 of the substrate 14 and a lower surface 20 of the substrate 14. An adhesive 22 may secure the electrical contacts 12 to the substrate 14 and the conductive layers 16*a*, 16*b* carried on the substrate 14, as taught in the above-identified Contact Array Patent (and other patents owned by Neoconix, Inc.).

The electrical contacts 12 as shown in this FIG. 2 are typically formed from a flat sheet of conductive material as taught by the Contact Array Patent and then formed into a three-dimension shape using a known manufacturing process such as is described in the Batch Forming Patent cited above. The electrical contacts 12 are formed into a cantilevered arm with a mounting or base portion 12*a* and a distal portion 12*b*. The electrical contacts 12 are resilient with spring characteristics, allowing the distal end 12*b* of each electrical contact 12 to flex (generally in an up and down orientation when mounted as shown in FIG. 2). The electrical contacts 12 thus have their distal end 12*b* positioned a distance D above an external (e.g., top) surface of the substrate 14 before forces are applied (e.g., the electrical contacts 12 are mated for conducting electrical signals).

However, where a thin and relatively incompressible coverlay 24 is shown in FIG. 1, the improved electrical connector embodiment of FIG. 2 includes a layer 26 of compressible material. This layer 26 of compressible material is significantly more compressible than the standard coverlay used in the prior art. It is also more compressible than materials used as housings or enclosures for electrical connectors and sockets. The thickness of the compressible material would preferably be thicker than the typical thickness of the standard incompressible coverlay. The layer 26 of compressible material is positioned adjacent to the surface of the insulating substrate 14 and may be secured to that surface of the substrate 14, if desired, for instance, using adhesive (not shown). As will be described later in this document, the layer 26 of compressible material may be formed from a single sheet of such material, with apertures formed in the locations where electrical contacts 12 will be mounted to allow the electrical contacts 12 to be contained within the apertures initially, and in many instances when fully actuated as well. In connectors that are manufactured using batch processing methods, such as the printed circuit-type fabrication methods used for the PCBeam connector, a plurality of connectors may be formed on a single substrate, and the compressible material may be of a size such that a plurality of individual connectors would reside within one sheet of the material, and the individual connectors would be singulated from the large sheet subsequently. The shape and size of the openings or apertures in the compressible material would be determined in part by the size and shape of the electrical spring contact. In an instance where it is desirable that a cantilever beam contact be fully contained within the aperture both in the uncompressed and fully compressed state, and there is one aperture defined for each spring contact, the aperture may be elongated along the longitudinal axis of the beam, and hence may be in the shape of a rectangle, trapezoid, oval, or other elongated shape that encompasses the outline of at least the distal end of the spring contact. In some embodiments, the openings shapes and sizes would preferably provide appropriate room to accommodate patterning process capabilities for the compressible material, including manufacturing tolerances, and also to accommodate alignment tolerances of the compressible material sheet to the connector array so the compressible material does not interfere with movement of the spring contacts. In other cases and for other types of spring contacts in connectors, the apertures may be round, square, or of other shapes.

The compressible material for the layer 26 may be chosen from a variety of different materials. One such material which has been proven by the inventors to work well in electrical connectors such as are described in this document is Poron® urethane foam, sold by Rogers Corporation. A particular formulation of this material that works well for certain connectors includes ShockPad 4790-79SP-15012 from Rogers Corporation. This particular commercially-available material is a composite of three layers, including the Poron urethane foam, a support film layer and a pressure sensitive adhesive layer. Other Poron materials are offered as freestanding urethane foam layers without a support layer and adhesive layer, or with a support layer with no adhesive, or in other configurations. This Poron urethane foam of the part number designated above has a density of approximately 15 pounds per cubic foot with an overall thickness of 0.30 mm (approximately 0.012 inches) including the Poron foam layer of 0.27 mm, a support layer of PET (polyester) for the adhesive of 0.013 mm and a pressure sensitive adhesive (PSA) of approximately 0.025 mm. This and other similar materials are available in a variety of foam thicknesses, and for some connector applications, other thicknesses and/or values for material properties such as density may be preferable. This Poron foam material is highly resistant to compression set or creep under many conditions. This urethane foam allows an applied force to compress the foam by a significant percentage of it starting thickness, but at a certain inflection point, the compression force to achieve a particular amount of additional compression increases rapidly and the foam material becomes nearly or practically incompressible at some point thereafter. This inflection point is believed to be the point where most of the gas has been forced out from cells in the material and a high percentage of the remaining volume of material is the urethane polymer itself. Materials such as urethane foam can be tailored during manufacturing to control the percentage of open space (frequently filled with air or other gas, and possibly with liquids) which is contained in the foam, the size and shape of the wall thicknesses, the presence and composition of fillers and gas bubbles, the rigidity and modulus of the urethane polymer, and whether the urethane internal aperture structures are "open cell" or "closed cell". The manufacturer of the foam can tailor these characteristics to provide a layer of compressible material with the desired characteristics. The manufacturer can also provide these materials in a variety of thicknesses and with or without support layers and adhesives. The thickness and density of a compressible material chosen for application in a connector to protect and improve the function of electrical spring contact elements would depend on the design and functional requirements of the connector, including the height of the spring above the surface of the connector and the amount of force that can be applied to compress the connector to mate it to a corresponding circuit member. In the case of the present invention, the desired characteristics include that the compressible material may be compressed by a significant percentage of its original height without requiring a high force before reaching the inflection point where the required compressive force increases greatly for an equivalent amount of compression. It is desirable that the thickness and density of the foam layer is chosen such that the inflection point of the force-compression curve occurs at some percentage compression where the compressed height of the compressible material is below the original height D of the spring contacts. It is desirable that the foam becomes highly incompressible at a percentage compression such that the spring contact element has not been compressed to an extent where the stress on the contact substantially exceeds its yield strength. It is also frequently desirable that the material does not 'squeeze out' or flow laterally to a significant extent when fully compressed, so that the size of the openings in the compressible material in the fully compressed state are not significantly smaller than they are when in the uncompressed state. In this way, they will not encroach upon or impede movement or function of the movable spring contact, unless this encroachment is desirable in some structures and would provide some beneficial attribute such as higher pressure of the contact spring against the mating pad for lower contact resistance. In the case of many PCBeam connectors, the desired thickness of the compressible material in its fully compressed state (when it becomes substantially incompressible) may be in the range of 1.0 mm to 0.01 mm, but more typically in the range of 0.15 mm to 0.025 mm. The desired thickness range where the compressible material becomes substantially incompressible may be different for application of this invention for other connector types. Many of the desirable materials for use in the present invention allow for compression of 50% to 80% of the thickness while the compression curve is relatively flat (requiring only a low compressive force), before the compression force rises sharply at an accelerated and sometimes exponential rate per unit of compression distance.

Of course, the layer of compressible material useful in the present invention is not limited to Poron urethane foam, and, in fact, a variety of other materials (including but not limited to polyurethane foams, polyethylene foams, rubbers, and silicones) could be used to advantage in the present invention. For example, either open cell foam or closed cell foams could be used to advantage, with closed cell foam perhaps having a better resistance to moisture penetration, if that is a significant concern. Some open cell materials become effectively impermeable to water above a certain level of compression, such as 40% to 70% compression from the original thickness. Hence, the layer of urethane foam such as Poron would potentially provide a water-resistant seal to the mating surfaces as the compressible material is compressed beyond a certain percentage, and it is desirable to obtain such a benefit if moisture is a concern in the application. In addition to Rogers Corporation Poron materials, Sekisui Voltek Volara® closed cell foam and Saint-Gobain Korel® foam products could be used to advantage in the present invention. In the case of high temperature applications or where high temperature processing such as surface mount technology is required, thermally stable compressible materials such as the silicone foam product manufactured by Rogers corporation under the product name Bisco®, or other elastomers such as silicone may be used to advantage, including elastomers that are compressible but are not foams. Poron, Korel and other compressible foam materials are also often engineered to be creep resistant, so these materials may be capable of maintaining a water-resistant characteristic for the life of the electrical connector and a mating electronic device. A uniform and well-distributed clamping force between the electrical connector 10' and the mating surface on a mating electronic device or circuit member would allow the layer 26 of compressible material to conform to the topographic features of the surfaces and form a water-resistant seal. It may also enable the interconnection to overcome the Z-axis tolerances of the materials and structures due to manufacturing and assembly variability. In some instances, filling the pores in the foam with a water resistant material like a high viscosity oil or a grease may enhance the water resistance of the compressible material in the connector.

As discussed above, materials other than the Rogers Poron urethane foam can be used to advantage in the present invention. For example, Saint Gobain's compressible material sold under its registered trademark Korel could be used, as could other easily-compressible materials such as elastomeric materials (such as silicone). In addition, materials which are not ordinarily easily compressible, but which become compressible under certain conditions, such as in the presence of heat or of certain solvents or other environmental conditions or factors, may be used in the present invention. In one such case, a material may be rigid when at normal room temperature, but soften and become compressible and/or conformable at an elevated temperature. Such a material might provide protection and robustness to the electrical contacts during manufacturing, packing, shipping, handling, assembly, and use. In order to actuate a connector with such a material, a localized heat source may be applied to soften the protective material and make it readily compressible, enabling the connector to be actuated to engage the spring contacts with mating circuit pads or traces on the mating circuit member while the temporarily compressible material is soft. Upon cooling, the material may again become rigid, depending on its nature. Another approach might be to use a solvent-softened material, which is dipped in a softening solvent just before assembly. A volatile, non-aqueous solvent may evaporate quickly after mating, and would potentially do no harm to the electronic system in which the connector was installed. In the case of a selectively compressible material, where certain conditions are required for the material to be easily compressible, it is possible that this material might also have adhesive properties. For example, the material might be a low temperature thermoplastic adhesive material which begins to soften as it approaches or exceeds its melt transition temperature. If the material is heated prior to or while the connector being compressed onto the mating circuit member, the material may become compressible and allow the electrical spring contacts of the connector to be compressed against mating circuit elements (e.g. pads, lands, or traces) on the mating circuit member, while the compressible material makes intimate contact to the circuit member surface around the mating pads and forms an adhesive bond. As the material is then cooled, it may become once again rigid—such that it is not easily compressed nor extended or stretched—and the adhesive bond formed to the mating circuit member may retain the connector to the circuit member and maintain the electrical spring contacts of the connector in a compressed state against the circuit pads on the mating circuit member. In this manner, there may be no requirement for any other clamping or retention means to maintain the connector in its operating state. Such a connector could also use other temporarily compressible materials, such as thermoset 'b-staged' materials, or could use thermoplastic materials without adhesive properties with a separate layer of another adhesive, actuated by pressure or chemistry or temperature or by other means.

The layer 26 of compressible material has a height H above the level of the insulating substrate 14 when the layer is in its relaxed or uncompressed state, with H preferably being somewhat greater than the height D of the electrical contacts 12. In this way, the electrical contacts 12 mounted on the substrate 14 with an uncompressed layer 26 of compressible material are provided with some protections against damage, since they are recessed below the surface of the compressible material. This protection for the electrical contacts 12 is desirable when the electrical connector 10' is being assembled, tested and shipped, since the electrical contacts 12 are often small and fragile and subject to damage from random and unplanned external forces, or can be scratched or marred or contaminated by contacting external surfaces. The structure achieved when height H of the compressible material 26 (when uncompressed) is above the height D of the electrical contacts 12 also provides other advantages in addition to making the electrical connector 10' more robust. The flat surface of the compressible material may be compatible with a vacuum nozzle for an automatic pick and place machine, which can simplify and automate the assembly of the connector into an electronic system. The flat surface may also be used as a temporary mounting surface. For example, an electrical connector with springs on both sides can be aligned to and temporarily mated to a flexible printed circuit, using a pressure sensitive adhesive or other tacky or adhesive material attached between the compressible material surface and the flexible printed circuit. The connector spring contacts would be aligned to the mating circuit pads on the flex circuit and then the pressure sensitive or other adhesive or attachment method would be used to attach the connector to the flexible printed circuit with the contacts remaining in alignment to the pads. In this manner, a one-piece flex-connector assembly can be made without surface mount technology, eliminating a solder reflow process that might typically otherwise be needed, and simplifying assembly processes and reducing costs. Ultimately, when the electrical connector in this embodiment is compressed between the flex circuit and the mating circuit member such as a printed circuit board, the spring contacts on both sides will be able to mate to the circuit pads on these opposing circuit members as the compressible material compresses. In addition, the compliancy of the connector solution in this embodiment is improved over connectors with springs on only one side and solder connections or other non-resilient connections on the other side, since there are springs on two sides of the connector rather than on one, effectively doubling the compliancy of the connector relative to a surface mount connector soldered to one of the circuit members. The adhesive used as an interim attachment means for the connector prior to clamping, to retain it in position on a mating circuit member, can have a high tackiness to provide a semi-permanent or permanent mechanical attachment, or it can be a 'repositionable' adhesive, allowing the connector to be easily removed and replaced or repositioned. Examples of the these various adhesives are manufactured and/or sold by 3M and Nitto, among other companies.

The layer 26 of compressible material may be positioned on one or more surfaces of the electrical connector (shown in FIG. 2 as being on both the upper (or top) surface 18 and the lower (or bottom) surface 20 of the electrical connector 10', although the present invention may be used to advantage on only one surface of some electrical connectors). An array of apertures in the layer 26 of compressible material may be formed, as desired, to provide openings corresponding to the locations of the electrical contacts 12 as they are mounted to the substrate 14 in the desired arrangement and position. This forming of the apertures can be accomplished by any known technique in the art, including laser ablation, micromachining, mechanical punching, stamping, drilling, routing or other method of providing the apertures in the desired size and orientation and positional tolerance on the layer 26 of compressible material. In a typical embodiment, the apertures of the layer of compressible material are designed so that the compressible material does not interfere with the normal movement of the electrical contacts 12 (e.g., the distal ends 12b of the electrical contacts 12 which are often resilient springs). For thin and/or low density compressible foam materials that may be mechanically fragile or dimensionally unstable, it is often advantageous to have an integral support layer within or on one surface of the compressible material. In these cases, thin support films such as polyester may make the compressible material less susceptible to damage during processing, including during the patterning of the material and during the attachment of it to the connector, and this support layer may also improve the dimensional stability of the material, preventing stretching, shrinking or other distortion. The support layer can be patterned simultaneously with the patterning of the compressible material, and the support layer can be thin enough so as not to significantly reduce the overall compressibility of the composite material. In such a case, the compressible layer may be significantly thicker than the support layer, and often five to ten times thicker or more. In some cases, where an adhesive is used to bond the compressible material to the connector, a film support layer is a preferred surface for attachment of the adhesive, rather than attaching it directly to the compressible material. The support layer may adhere better to the adhesive, or it may prevent low viscosity adhesive from flowing into the cells of an open cell foam material.

In some cases, it may be advantageous for the support layer to be a conductive layer, such as a metal foil layer. In such a case, the support layer may provide electro-magnetic radiation shielding, or function as a supplemental ground plane, or provide enhancement of thermal dissipation, or have other advantageous properties. It may be necessary to pattern the metal support layer selectively to maximize the benefits of this layer. The conductive layer may also be distinct from a non-conductive support layer, and potentially may reside on one surface of the support layer. In this instance, the conductive layer may function not as a support layer but rather to enhance electrical or thermal performance. In some instances, it may be advantageous for the compressible material itself to be electrically and/or thermally conductive, either as a whole or selectively, as in selective positions on the connector or on one of the two surfaces of the compressible material.

In the preferred embodiment of FIG. 2, the layer of compressible material extends a height H above the substrate (before any compression, as discussed later), compared with the distal end 12b of the electrical contact 12 which extends a height D above the substrate, with the height H being slightly greater than the height D so that the top surface of the layer of compressible material is slightly taller than the tops of the distal ends 12b of the electrical contacts 12 when both are in their uncompressed states. Alternatively, the layer of compressible material may be approximately the same height H as the height D of the top of distal end 12b of the electrical contact or even slightly lower. When the electrical contacts 12 are recessed below the surface of the layer 26 of compressible material, the electrical contacts 12 have some protection from being scratched, bent, contaminated, or otherwise damaged during handling of the electrical connector 10' (as during assembly).

Figure 7:
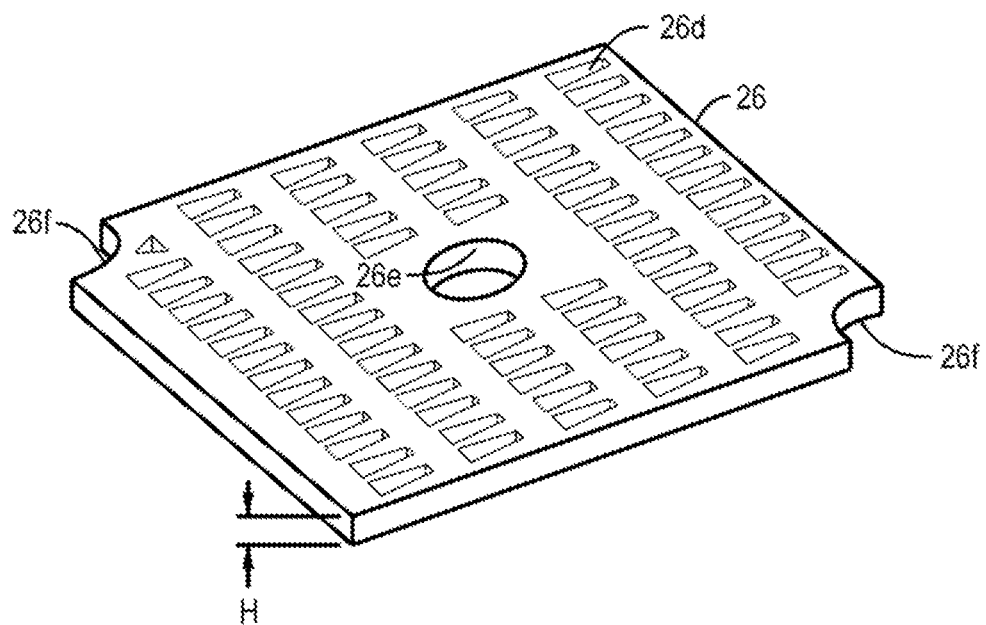
Figure 8:
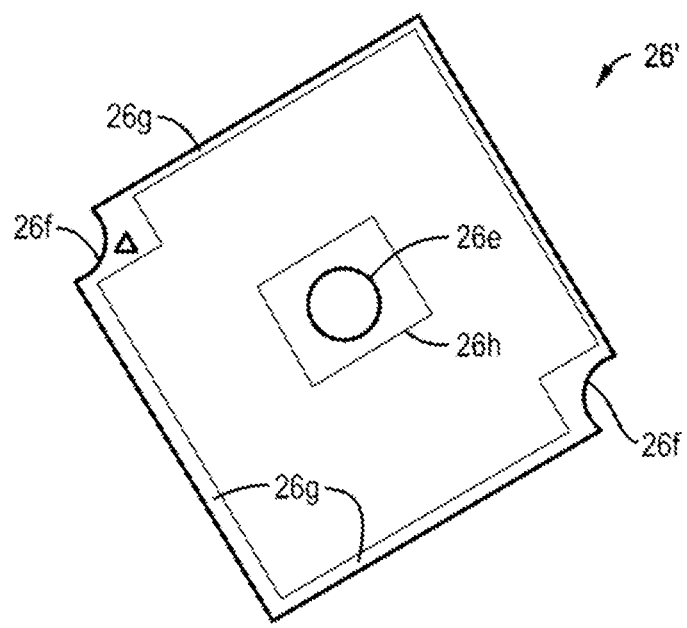
FIG. 8 shows a variation of the compressible material.

While one embodiment of the present invention envisions using a sheet or layer 26 of compressible material with individual apertures for each electrical contact 12 (FIG. 7), the present invention could be implemented with a single aperture surrounding a plurality of electrical contacts 12 (for example, one aperture for each two adjacent electrical contacts 12, with another aperture for the next two adjacent electrical contacts 12), or even an electrical connector 10' in which all (or a large group) of the electrical contacts 12 are surrounded by a perimeter layer 26 of compressible material (see FIG. 8 and related discussion). In another embodiment of a connector providing an interconnection for electrical power, such as a battery connector, the power contacts may reside in one opening in the compressible material, and the ground contacts may reside in a second opening in the compressible material. If there are also signal contacts present, such as for battery monitoring or control circuits, they may reside in yet another opening in the compressible material, or each signal contact may have its own opening.

In another embodiment, the dielectric properties of the foam material may be chosen to enhance high speed or high frequency electrical performance of the interconnection. For example, the foam or elastomer may have a very low dielectric constant, and a very low loss tangent (or dissipation factor). For example, fluoropolymer based materials have such dielectric properties. Expanded polytetrafluoroethylene (PTFE) materials such as are manufactured by W.L Gore and Associates may be usable in such an embodiment. In another embodiment, a foam material with a relatively low loss polymer structure may be only partially compressed upon connector actuation, so that a significant volume of the foam is made up of air, which itself has very favorable dielectric properties, so that the connector performs well at very high frequencies.

FIG. 3 are views which depict the differences in mating between an electrical connector with a standard rigid coverlay or housing (FIGS. 3a and 3b) and an electrical connector with a layer of compressible material of the present invention (FIGS. 3c and 3d). The electrical connector 10 of FIGS. 3a and 3b is being mated with a board 40 carrying electrically conductive circuit elements (such as pads) 42. FIG. 3a shows the board 40 and the electrical connector 10 prior to mating and FIG. 3b shows the board 40 and the electrical connector after mating, with the electrical contact 12 in contact with the circuit element 40 to provide an electrical interconnection between the electrical connector 10 and the board 40. The electrical connector 10 of FIGS. 3a and 3b includes the electrical contact 12 and the coverlay 24 as described in connection with FIG. 1. As shown in FIG. 3a, the electrical contacts 12 extend above the level (height) of the coverlay 24 and thus are subject to damage prior to mating. The illustrations of this FIG. 3 may include additional conventional connections on the other side of the connector—whether another spring or a solder ball, etc., but are not shown in this FIG. 3. The coverlay 24 does not compress when force is applied because the coverlay 24 is made of a high modulus, relatively incompressible, material and the electrical contact 10 extends above the top of the top surface of the coverlay 24 prior to assembly of the board into a mating position (as shown in FIG. 3b) where the mating depresses the cantilevered arm distal end 12a of the spring beam electrical contact 12.

While the initial (uncompressed) height or thickness of the compressible material would preferably be such that the top surface stood proud of (higher than) the electrical contacts in their uncompressed state, in some applications the electrical contacts are spring elements with a beam-shaped structure where the distal end 12b has a "roll over" such that the apex or highest point of the beam resides slightly behind the distal tip or terminus of the electrical contact. In such an embodiment it may be sufficient for the height of the compressible material to be less than the height of the apex of the beam, but it is preferable that the height of the layer of compressible material (when uncompressed) be higher than the extreme distal end of the electrical contact, which itself is more easily caught or snagged during handling and hence more susceptible to damage if not recessed below the compressible material surface.

It is possible in some instances, based on the type and design of the electrical spring contact, that the spring contact will plastically deform and yield during its first compression. This could occur if the stress on the spring during compression exceeds the yield strength of the spring or of plated layers on the spring. In this instance, the spring height D could be designed to be slightly taller than the height of the compressible material, H, initially, but after the first compression cycle, the spring contact would take on a compression 'set' due to plastic yielding, and subsequently remain below the height H of the compressible material and hence protected from damage. In this case, the connector manufacturer may choose to perform a first full compression, for example at final connector electrical testing, to 'set' the contacts to their ultimate height and so that they are protected by being below the height of the compressible material. In an instance where the primary concern is not damage to the spring contacts from mechanical forces, but rather is preventing the ingress of water during use of the connector in an electronic device, it may be preferable to design the compressible material to have a height that is lower than the height of the spring contacts in their respective uncompressed states. Some materials that may be provide a superior sealing function than open cell foams, such as closed cell foams or non-foam elastomers, may have a higher typical compression force per unit of compression distance, and the forces required to fully actuate the connector may be excessive if the material thickness is high. For example, with open cell foams, a percent compression of 70 to 80 percent may be feasible for a connector, whereas with a closed cell foam, this would require a larger and impractical amount of compression force. By using a thinner layer of closed cell foam, the percent compression required for the foam to enable full connector actuation is lower and may be in a practical realm for the connector and electronic system. The same principle may be true where the desired function of the compressible material is primarily to improve high speed performance of the connector. A somewhat less compressible material than low density, open cell foam but which has superior dielectric properties at high frequencies, such as an expanded PTFE material, may only be mechanically practical from the perspective of required compressive forces if the material thickness is such that the distal ends of the contact springs sit taller than the compressible material.

FIGS. 3c and 3d show the use of the connector 10' of FIG. 2 with the layer 26 of compressible material being mated with the board 40. The electrical contacts 12 are recessed below the top surface of the layer 26 of compressible material before mating, as shown in FIG. 3c. The distal end 12a of the spring beam electrical contact 12 is similarly compressed by the mating of the board 40 shown in FIG. 3d, but the layer 26 of compressible material is also compressed as a result of the mating (the layer of compressible material 26 is shown uncompressed in FIG. 3c). The layer 26 of compressible material is substantially shorter in FIG. 3d (compared with FIG. 3c) when the board 40 mates with the electrical connector 10'. Shown in these figures illustrating the layer of compressible material (FIGS. 3c and 3d) is an adhesive mounting layer 26a which may be a pressure-sensitive adhesive layer, or an alternative adhesive such as a curable adhesive (and the adhesive mounting 26a is relatively incompressible). A thin layer of adhesive (not shown) may secure the coverlay in FIGS. 3a and 3b.

Figure 4:
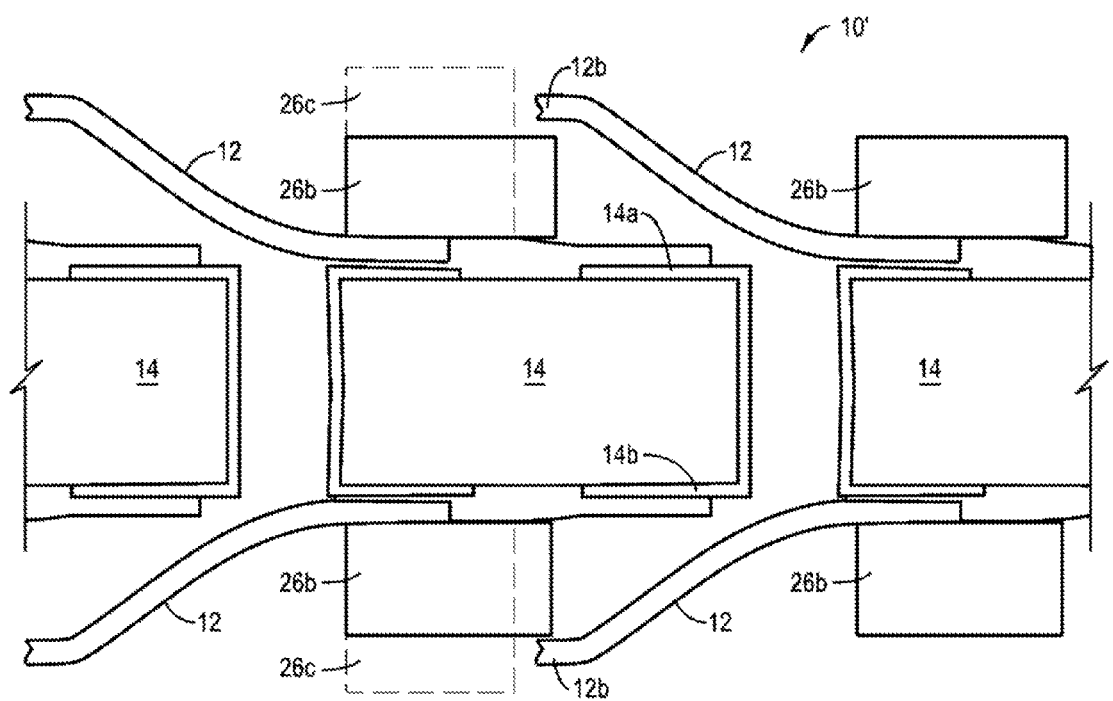
FIG. 4 shows the electrical connector of FIG. 2 of the present invention showing a modification of its layer of compressible material.

FIG. 4 shows a cutaway side view of the electrical connector 10' of FIG. 2 with a modified version of the layer 26' of compressible material. As shown in this view, the modified layer 26' of compressible material includes a first portion 26b which extends under the distal end 12b of the electrical contact 12. An optional second portion 26c of the layer 26 of compressible material is shown with dotted lines and extends above the height of the distal end 12b of the electrical contact 12, outside the region where the distal end 12b of the electrical contact 12 flexes or displaces when a force is applied to the electrical contact. Thus the first portion 26b provides a cushion under the distal end 12b of the electrical contact 12 and the optional second portion 26c provides protection for the electrical contact 12 in general by extending to or slightly above the height of the electrical contact 12 before it is acted upon by external forces (such as the mating of another component, such as the board 40 shown in FIGS. 3a-3d). This structure may increase the spring force of the electrical contact spring, potentially reducing constriction resistance and improving the penetration of contaminants that may exist on the mating circuit element, and thus reducing contact resistance.

Figure 5:
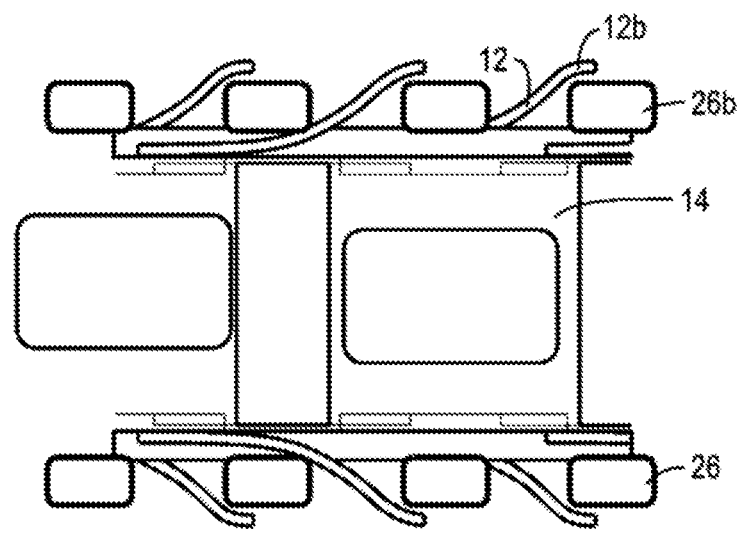
FIGS. 5 and 6 are cutaway side views of electrical connector of FIG. 4, with FIG. 5 showing the electrical connector prior to mating and FIG. 6 showing the connector while mated to another connector (not shown)
Figure 6:
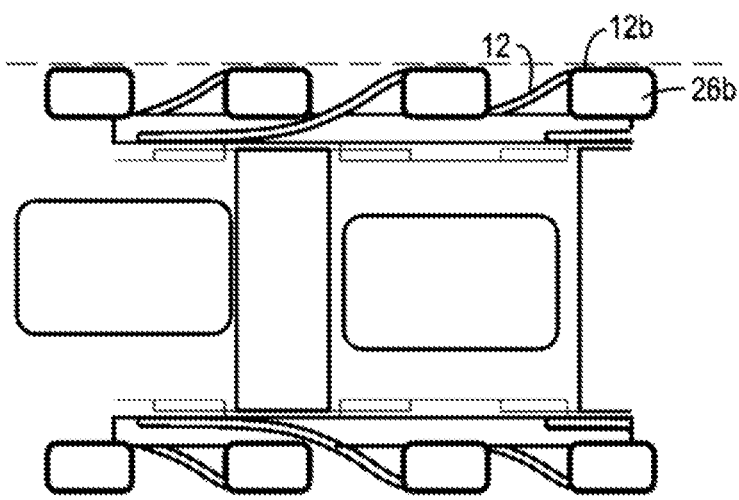

FIGS. 5 and 6 show the compression of the electrical contacts 12 (springs) and the use of the first portions 26b of the layer 26 of compressible material which provide cushioning below the distal ends 12b of the electrical contacts 12. FIG. 5 shows the electrical contacts 12 mounted on the substrate 14 prior to mating, in which the distal ends 12b are ideally positioned above the first portions 26b of compressible material and the height of that first portion 26b is relatively higher than it is in FIG. 6 (where the distal ends 12b of the electrical contacts 12 (springs) have been depressed by the forces involved with mating the electrical connector with a mating member. The force of the distal ends 12b compressed the first portions 26b of compressible material to cushion any impact on the distal ends 12b.

FIG. 7 shows a perspective view of a typical layer 26 of compressible material which is useful in the present invention. As shown here, the layer 26 of compressible material has a thickness H and includes a generally rectangular piece of compressible material (although any shape can be used to match or approximate any connector shape and footprint) with a plurality of apertures 26d, one aperture 26d for each of the electrical contacts (not shown in this view) which are used in the present electrical connector 10'. The apertures 26d in the layer 26 of compressible material are precisely positioned to accommodate each electrical contact in its desired location, and the layer may have locating structures (such as hole 26e, corner cutaways 26f, pins etc.) to cooperate with the features on the substrate (not shown) to position the layer in the desired location and orientation.

FIG. 8 shows a perspective view of an alternate embodiment of an alternate design layer 26' of compressible material, wherein it the compressible material is provided around the periphery of the electrical contacts (not shown in this view). The alternate design layer 26' of compressible material includes a peripheral wall 26g that extends around the outer periphery of the electrical contacts.

Figure 9:
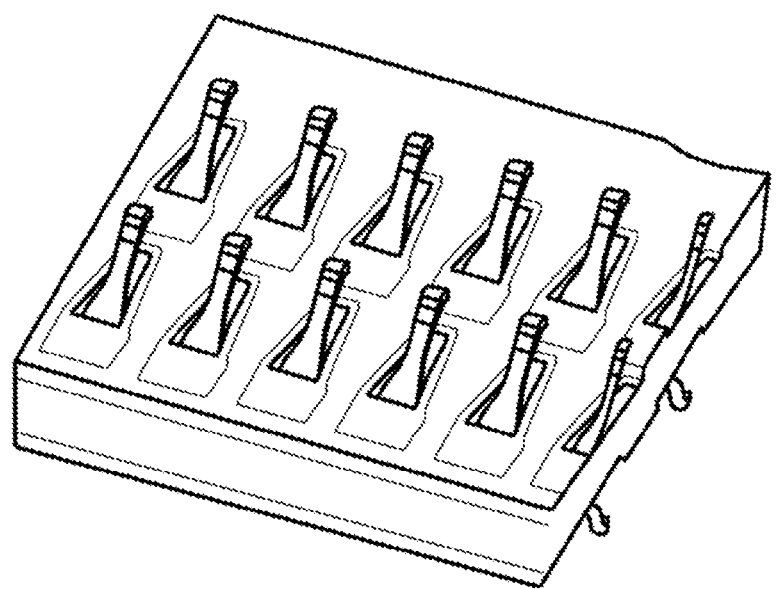
FIG. 9 shows a perspective view of a portion of the electrical connector with its electrical contacts of FIG. 1.

FIG. 9 is a perspective view (with a partial cutaway at the right side) of the electrical connector 10 of FIG. 1 in which a plurality of electrical contacts 12 extend through apertures in the coverlay 24. Since the coverlay 24 is relatively thin compared with the height of the electrical contacts 12, the electrical contacts 12 extend through the coverlay 24 and stick out, making the electrical contacts 12 (which are small and thin) subject to damage from external forces or to contamination.

Figure 10:
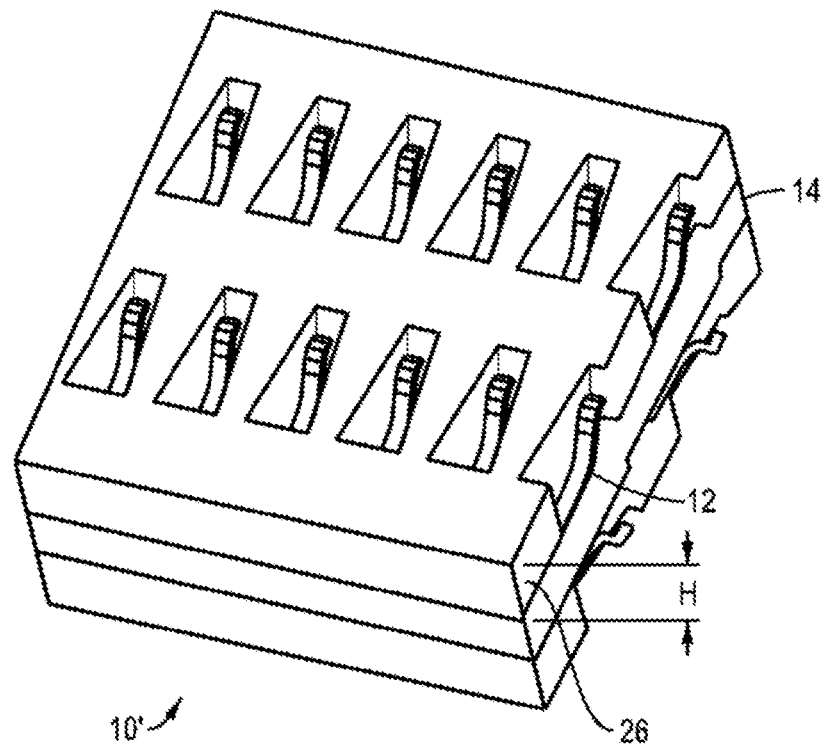
FIG. 10 shows a perspective view of a portion of the electrical connector of FIG. 2 with its electrical contacts and layer of compressible material.

FIG. 10 is a perspective view (with a partial cutaway at the right side) of the electrical connector 10' of the type shown in FIG. 2, an embodiment of the present invention. In this view, the electrical connector 10' includes a plurality of electrical contacts 12 of a similar design (and size) to the electrical contacts 12 which are depicted in FIGS. 1 and 8. However, the layer 26 of compressible material 26 has a height H (when the layer 26 is not compressed) which is greater than the height of the electrical contacts 12 so the electrical contacts are recessed below the top surface of the layer 26 of compressible material (when that layer 26 is uncompressed).

Figure 11:
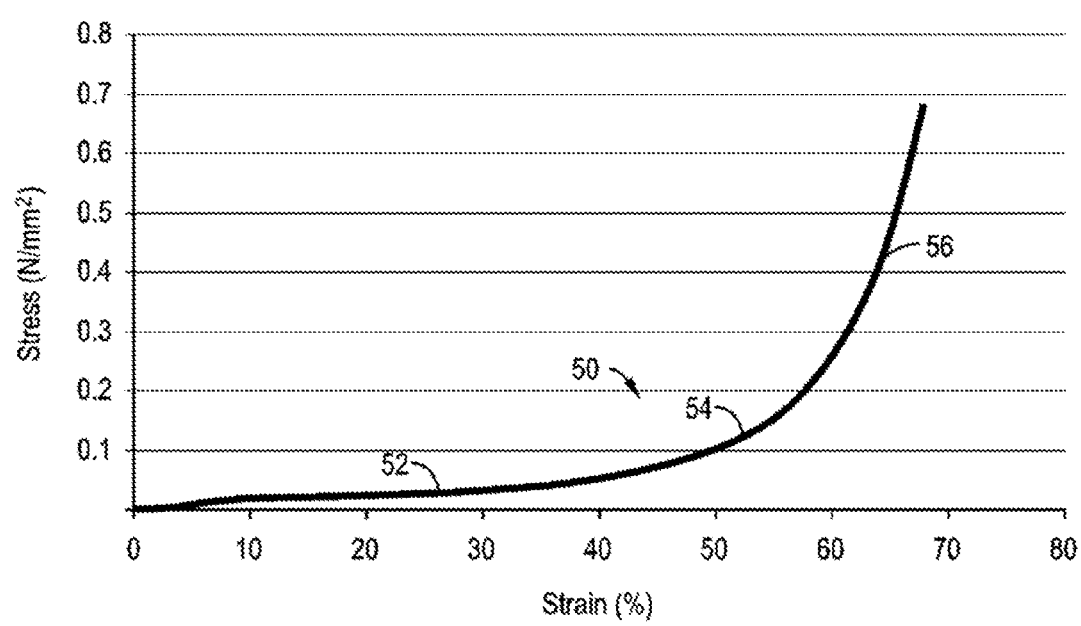
FIG. 11 shows a typical plot of force (shown in this figure as stress) versus percent compression or displacement (shown in this figure as percent strain) for a layer of compressible material useful in the present invention.

FIG. 11 is a graph which illustrates a typical plot of force versus compression (or stress versus strain) for a layer of compressible material useful in the present invention. While this plot relates to the Poron® ShockPad urethane foam material 4790-79SP-15012 described above in connection with FIG. 2 (for the preferred thickness described therein as well as the related adhesive material), other compressible materials which have similar characteristics could also be used to advantage. This graph shows a plot 50 of the force or stress (on its vertical or y axis) versus compression (or strain) on its horizontal or x axis. This plot 50 includes generally three regions, a relatively flat first region 52, showing that a relatively low incremental increase in force causes a significant increase in percent compression of the layer of compressible material. In this region is the relationship between force and percent compression is approximately linear. A second region 56 is shown where a larger incremental increase in force causes a relatively small increase in percent compression (where the force-displacement relationship may be, in some instances, an approximately exponential relationship, and in any case with a much greater average slope than the first region), with an inflection portion (or transition region) 54 connecting the first region 52 and the second region 56. After the inflection portion 54, the compression versus force curve begins to steepen dramatically—and the compressible material chosen (its material, thickness and any included fillers) so that its thickness at the percentage compression where the force increases dramatically would be in the range of 0.01 mm to 0.5 mm, in the case of Neoconix' PCBeam™ connectors and, more typically, in the range of 0.025 to 0.1 mm. For other types of connectors, the preferred thickness range of the compressible material where the inflection occurs may be different. While it is desirable to choose the material, thickness and force so that the layer of compressible material is compressed somewhere between 10% and 90% compression, it is preferable that the compression be within the range of 60% to 90%. It is also preferable that the inflection point in the force versus compression curve occur at a compressed thickness of the compressible material that is less than the initial height D of the electrical contacts.

Figure 12:
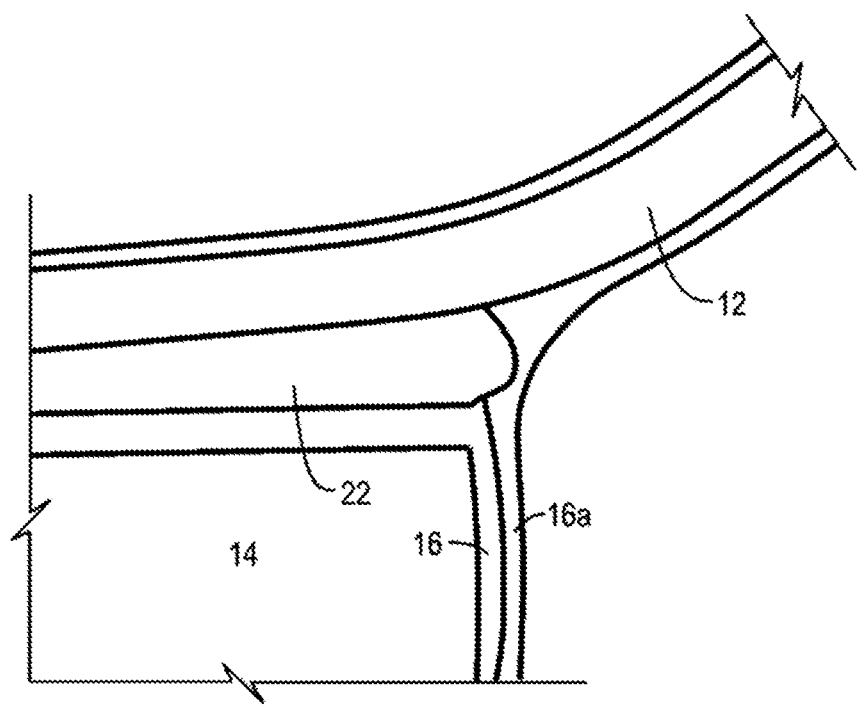
FIGS. 12 and 13 show enlarged portions of an electrical contact that can be used in concert with the present invention.
Figure 13:
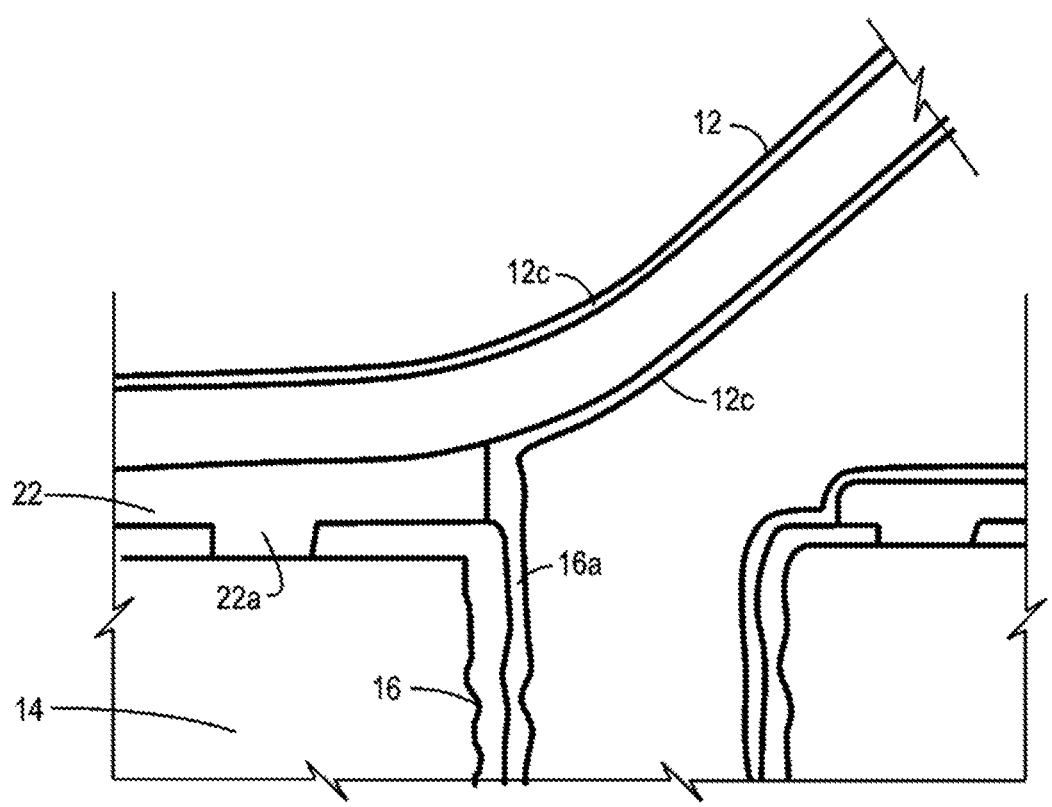

FIGS. 12-13 are enlarged views of portions of mounting of the electrical contact 12 to the electrical connector 10' (or spring element) useful in the present invention and may help to describe one reason why the electrical contacts 12 used in the electrical connector 10' can be damaged in manufacture, testing, packing, shipment, handling and final assembly. The electrical contact 12 is formed from a thin conductive sheet of a high conductivity spring material such as a copper alloy. In some embodiments, the spring copper alloy may contain a small percentage of beryllium, or of other alloying elements such as nickel and/or tin and or phosphorous. Using a thin contact sheet enables high levels of integration so that the connector can have many miniature electrical contacts in a small area. Thicker contact sheet materials may provide a more robust electrical spring contact, but may limit the ability to achieve higher levels of integration or miniaturization. The electrical contact 12 can be secured to the substrate 14 using an adhesive 22, with a reservoir 22a often being provided to allow for excess adhesive 22 to flow into the reservoir as an overflow area, if desired. A plated interconnection such as electrodeposited copper 16a may be used to couple the contact 12c to the conductive vias 16. The contact is designed to be compressed vertically in z axis downward, and to spring back to its initial position. In this mode of use, the contact is very robust and durable. However, repeated and/or forceful impacts to the electrical contact 12 in a direction not intended in normal use (such as laterally or upward) can potentially distort or plastically deform or scratch or contaminate the spring contact, reducing its effectiveness as a spring contact. Such forces do not typically happen within an electronic system, but can be sustained on occasion during handling or assembly of the connector into a subcomponent or system.

It is desirable that the electrical connector 10' embodying the present invention require a reasonable force to mate the connector with a mating electronic element such as a printed circuit board or a flexible printed circuit. Electrical contacts 12 on an electrical connector 10' require a finite force to sufficiently compress the springs against the mating member (e.g., an electrical circuit pad) in order to make low resistance electrical contact. The required force can typically range from less than a gram per electrical contact 12 to several hundred grams per electrical contact, but, more typically, may be in the range of 10 to 100 grams per electrical contact 12. Neoconix connectors frequently require between 10 and 80 grams of compression force per contact and most commonly 15 to 60 grams per electrical contact 12. Implementing the layer of compressible material in the connector requires an additional amount of force to compress the compressible material simultaneously with the electrical spring contacts, but it is desirable that the inclusion of this compressible material does not add significantly to the total compressive force required to actuate the connector, nor that the total force exceeds a critical compressive force for the connector. For example, a compressible material that requires ten times the compressive force that the electrical contacts alone would require to be actuated in absence of the compressible material might be difficult to implement in a miniaturized electronic system like a mobile phone, due to more challenging requirements for fixturing and clamping to apply and maintain the required compressive force. However, a compressible material that requires approximately two to three times (or less than two times) the compressive force required by the electrical contacts should be quite easily integrated into an electrical connector 10' for many applications. In many of the designs, the layer of compressible material may add only 30-75 percent to the compressive force of the electrical contacts 12. In other applications, the compression force required to compress the electrical spring contacts can be reduced by modifying their design, in order to counteract the added compressive force required by the compressible material surrounding the contacts. For example, the thickness or width of the cantilever beams showed in FIG. 10 could be reduced to reduce the compression force required to compress these spring contacts, as such helping to counteract any increased force required to compress the compressible material.

The foregoing discussion included the use of an adhesive for attaching the layer of compressible material to the connector, including materials such as a pressure sensitive adhesive (PSA) film, preferably integrated with the layer of compressible material. Many urethane foams are commercially available with PSA materials already on one or both surfaces of the material. In other cases, these PSA layers can be applied by a third party or by the connector fabricator. The layer of compressible material can also be attached to the connector with thermoset 'curable' adhesives such as epoxies or acrylics or other materials, or with thermoplastic adhesives, in place of a PSA. In the case of a liquid adhesive, or of a curable or thermoplastic adhesive which attains a low viscosity prior to fully curing, a closed cell foam compressible material may be preferable, to prevent the adhesive from flowing into the compressible material pores during attachment or during the curing process so that the properties of the layer of compressible material are not adversely impacted by the infiltration and curing of the adhesive within its pores. Other adhesives such as elastomeric adhesives including silicone adhesives or liquid 'contact adhesives' such as rubber cement or contact cement can also be used, as can cyano-acrylate adhesives. Other attachment methods are also viable, such as a mechanical attachment.

The layer of compressible material may be a supported or unsupported foam or elastomer. For example, the urethane foam compressible material may be freestanding or may be supported by a Mylar™ or other polyester film or by polyimide or other non-conductive or conductive films. If the compressible material is attached to a PSA, the PSA may have a protective, peelable release layer which is removed prior to attachment of the layer of compressible material to the electrical connector 10'.

Alignment and attachment of the layer of compressible material to the electrical connector 10' may be accomplished at the individual connector level. Alternatively, if the electrical connector is batch processed in panels or strips, each containing an array of many connectors, the alignment and attachment of the layer of compressible material may be accomplished in sheets with a tooling jig that includes alignment features such as alignment pins. In one embodiment, the tooling jig has a fine dispersion of vacuum holes which affix the outer surface of the layer of compressible material to the tooling jig after using tooling pins in the jig and tooling holes in the layer of compressible material and connector to align them to one another. If the layer of compressible material has a PSA and protective Mylar sheet, the vacuum can hold the layer of compressible material in place while the layer of Mylar is removed to expose the PSA, then pressed into place on the connector. It may be desirable to attach a piece of releasable tape to the outer surface of the layer of compressible material so that the pre-patterned openings, if present, for the electrical contacts don't interfere with the vacuum hold down of the layer of compressible material to the tooling jig. This releasable tape may be a low or moderate tack PSA, or it may be a UV-releasable material or a heat-releasable material.

Some electrical connector designs may have one or more openings within the body of the connector that provide clearance for a clamping device like a screw, or which provide alignment to a pin or post that is attached to a mating circuit element like a printed circuit board. The layer of compressible material in such an instance, as shown in FIGS. 7 and 8, may include a round aperture 26e to accommodate that post or screw. This aperture may be slightly under-sized, or may be star-shaped in some applications, to provide retention of the screw to the connector, i.e. to grab onto a screw which is inserted due to an 'interference fit'. In some cases, there may be openings in the connector body and approximately concentric openings in the compressible material, to accommodate tooling pins or posts for alignment. In this instance, a slightly under-sized opening in the compressible material that results in a tight 'interference fit' with the tooling pin may provide retention of the connector on the tooling pins and in proper position and alignment temporarily, enabling additional component placement operations and/or transfer of the assembly to another process or inspection station, until it is actuated and clamped or screwed into place. If a round aperture is used, it might be sized slightly smaller than the screw or post diameter to improve the retention, or it may be designed with a tab or a protrusion into the opening to provide the interference fit. The corner apertures 26f shown in FIGS. 7 and 8 may also accommodate a mechanical feature such as a tooling pin or post that provides alignment of the connector to the PCB, and that assembly may be created by placing the electrical connector 10', a flex material, a stiffener and a screw assembly on the board with mild interference between a flex tab and pins to hold the assembly in place, then move the assembly to an automatic or manual screw station where the assembly may be screwed into place including the layer 26 of flexible material.

Of course, many modifications and adaptations can be made to the preferred embodiment without departing from the spirit of the present invention. Some of the alternatives have been discussed to some extent in the foregoing description. Others will be apparent to a person of ordinary skill in the art to which the present invention pertains. For example, while the preferred embodiment uses a single layer of compressible material, similar advantageous effects could be obtained from a plurality of layers of materials that include one or more layers of compressible materials, either comprising the same compressible material or combinations of different materials. These multiple layers could be mounted to a single electrical connector, or one layer could be mounted to one half of a mating pair of electrical connectors or components and the other layer to the other half of the pair. While many applications would benefit from the layers of compressible material to be secured in place using an adhesive, some applications may be able to dispense with the adhesive and have the layer of compressible material positioned in the desired location using other suitable locating devices, such as locating pins and similar structures with complementary apertures. Further, some of the features of the present invention could be used to advantage without the corresponding use of other features. For example, some electrical connectors might use a relatively incompressible coverlay positioned over the base of the electrical contacts as well as a layer of compressible material around each of the electrical contacts. In this instance, the incompressible layer may be thinner than the typical prior art coverlay shown in FIGS. 1 and 9. An example of a thin, rigid first coverlay layer might be a 0.0005" thick polyimide coverlay with a 0.0005" thick acrylic adhesive used to attach it to the connector. In this instance, the total thickness of the incompressible layer would be less than 0.001" after attachment, due to compression and flow of the adhesive during lamination, and a somewhat thicker layer of compressible material could be attached on top of or above the incompressible layer. The incompressible layer under the compressible layer may provide advantages in some cases, such as making the attachment strength of the electrical spring contacts to the connector substrate more robust by overlapping and encapsulating the base region of a cantilever beam type of spring contact, while the compressible layer above the incompressible layer provides protection from damage to the spring contacts, and/or seals the interconnection from rapid moisture or fluid ingress.

The provision of a layer of compressible material under the distal ends of the electrical contact may be formed from a separate, thinner sheet of compressible material distinct from the layer of compressible material which extends to a height above the tops of the electrical contacts, if desired, or the multi-level layer of compressible material may be formed from a single sheet of compressible material. If two separate layers of compressible material are provided, these layers might be formed of different materials or having different characteristics.

In a preferred embodiment, the compressible material is a permanent part of the connector. In this embodiment, the compressible material would be attached to the connector during connector manufacturing, and would remain with the connector when installed into an electronic system and actuated to make electrical interconnection. In this embodiment, the compressible material may be highly compressible such that during actuation, the force required to compress the material is low and the electrical contacts can easily be mated to the conductive circuit paths on the mating circuit member.

In another embodiment, the compressible material could be temporarily attached to the connector, for example to provide protection during later stages of connector manufacturing, testing, and final quality assurance and/or during initial stages of connector incoming quality assurance, testing, assembly and installation into an electronic system. For example, the compressible material may provide a suitable surface for the vacuum nozzle of a pick and place machine to pick up and place the component on a circuit member during assembly, and provide protection during the assembly process. It is possible the compressible material could be removed after placement of the connector, and before actuation.

In an embodiment whereby protection of the spring contacts is not the primary motivation, but rather sealing the interconnection from moisture or fluid ingress is the primary desire, the compressible layer can be attached to the mating circuit member, such as a printed circuit board or a flexible printed circuit, with apertures to expose the conductive circuit elements to which the connector contact springs are to mate. This embodiment could provide a sealed interconnection when the connector was compressed against this layer. Alternatively, thinner layers of compressible material might be placed both on the connector surface and on the mating circuit member surface, and these two compressible material layers would compress against each other to form a seal.

Figure 14A:
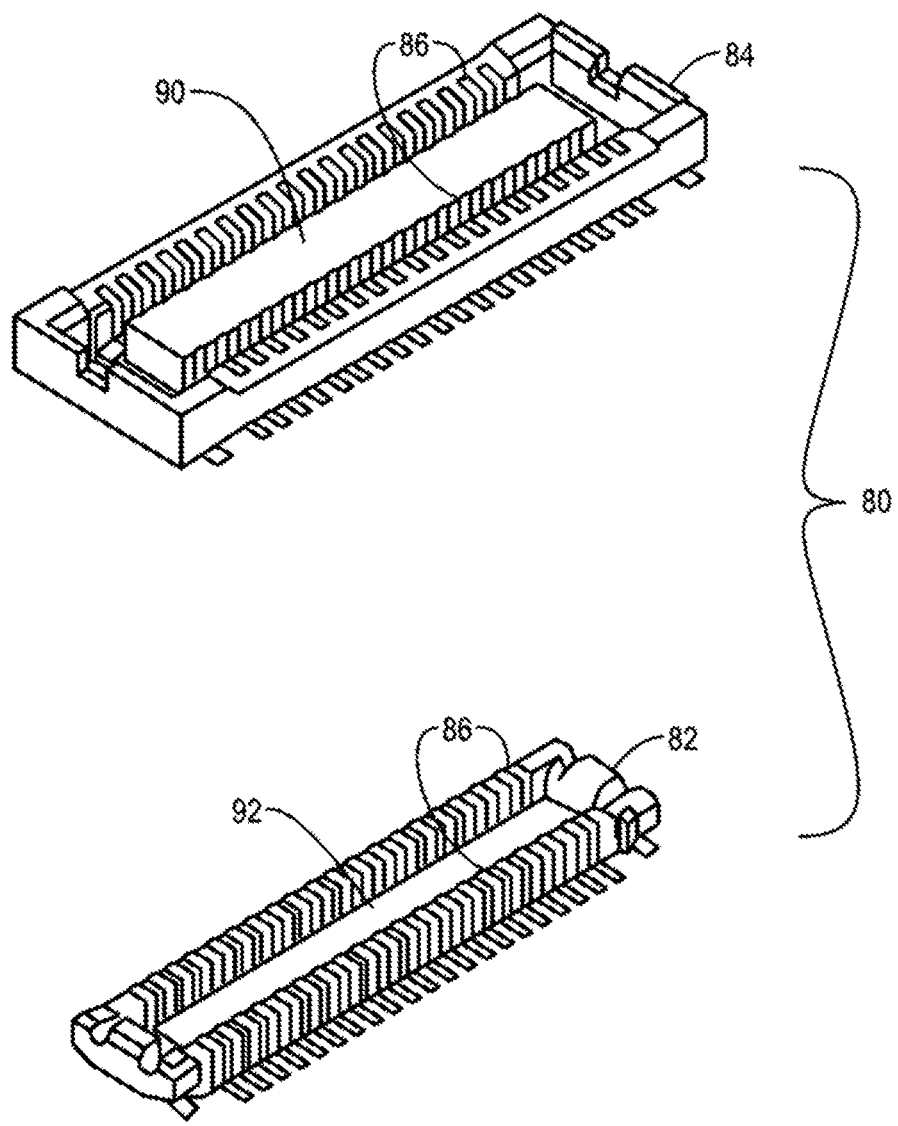
FIG. 14a and FIG. 14b show an alternate embodiment of electrical connector, where
Figure 14B:
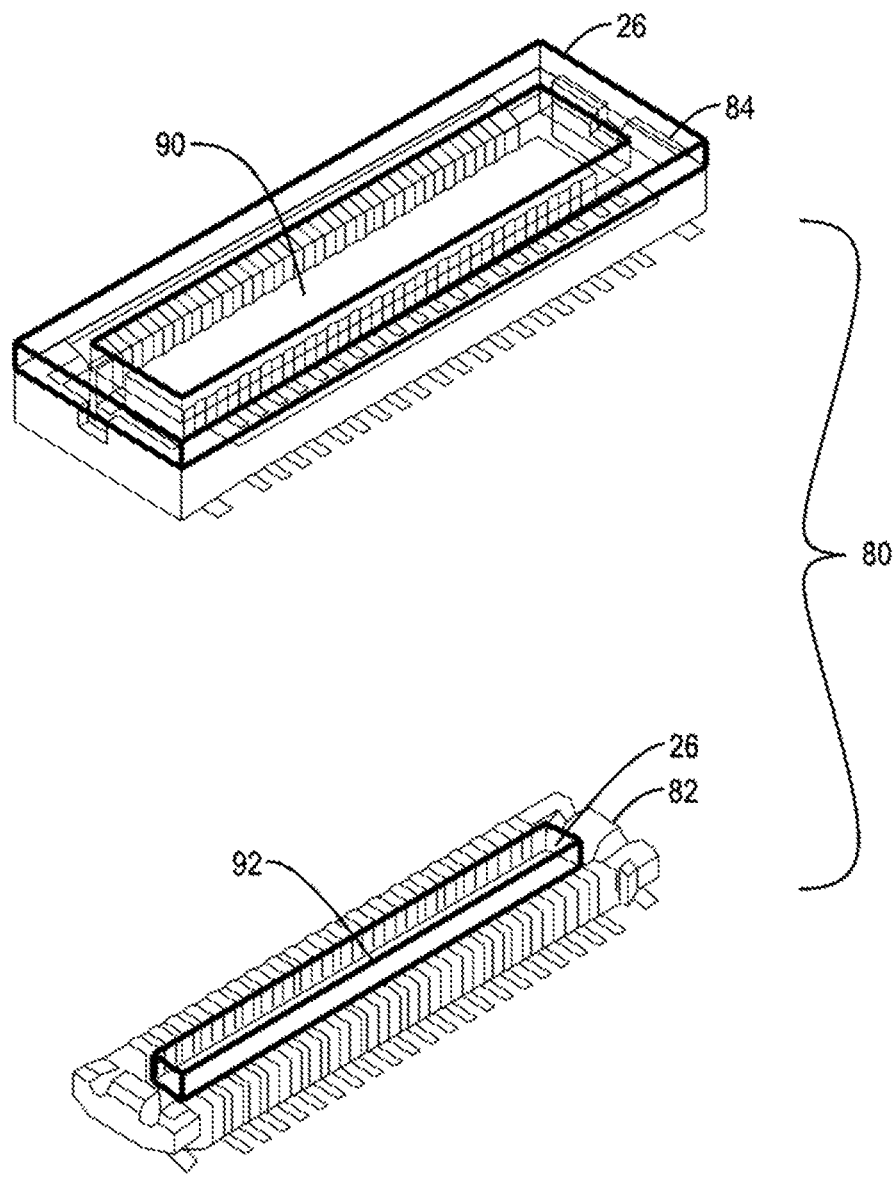

In other embodiments as shown in FIGS. 14a and 14b, the invention may be used in a current commonly used two piece, stacked board to board connector 80 as shown in FIG. 14a. Such connectors 80 typically have a header (or male) component 82 and a socket (or female) component 84, and are often made of injection molded plastic such as liquid crystal polymer, frequently having a flat 'suction face' 90 for a pick and place nozzle on the socket 84 and a similar suction face 92 on the header 82. In some designs of these connectors 80, spring contact elements 86 may be exposed and subject to some handling damage during handling, assembly, surface mounting, and during connector mating. A layer 88 of compressible material may be used in accordance with the present invention to protect these spring contact elements 86 from damage during handling and use, and may afford other benefits as described in this application, including water resistance. The compressible layers in this embodiment may also prevent damage to the connector in the event that the header and socket are misaligned during mating, by cushioning the respective rigid plastic housings and spring contacts during the mating process.

In another embodiment (not shown), the electrical spring contact elements 86 could be embedded directly into a first circuit member such as a flexible printed circuit, a printed circuit board, a multilayer printed circuit board, an HDI printed circuit board, a semiconductor package substrate, or other electronic circuit member, in an area where a separable electrical connection to another circuit member is required. Instead of a separate connector, the embedded spring contacts would be directly and permanently electrically connected to circuit pads and conductive paths in the first circuit member, using plating or metal joining or electrically conductive adhesive or by other means, and these spring contacts having elastic, distal ends that are meant to engage conductive mating pads (or similar conductive circuit connections) on a second circuit member. Such spring contact elements 86 would be particularly prone to damage during handling of the circuit members prior to actuation, since they typically go through multiple handling, test, inspection, and assembly process steps as well as final system assembly, and thus would greatly benefit by adding the layer of compressible material protection described in this document.

Accordingly, it will be appreciated that the description of the preferred embodiment presented in this document is for the purpose of illustrating aspects of the present invention and not to limit the scope of that invention.

Having thus described the invention, what is claimed is:

1. An electrical connector comprising:
   A substrate;
   A plurality of movable electrical contacts mounted to the substrate and extending a distance D from the substrate;
   A layer of compressible material mounted to the substrate, said layer of compressible material extending a thickness H, which is more than the distance D, from the substrate when uncompressed, and which when compressed by a mating circuit element or connector to have a thickness less than the height D when mated, the layer of compressible material has a force-to-compression plot which includes an inflection defining a first region of lower force and a second region of higher force, wherein a given increment of force provides substantially more compression in the first region than the compression which the same increment of force provides in the second region.

2. An electrical connector of the type described in claim 1 wherein the layer of compressible material surrounds at least one of the electrical contacts.

3. An electrical connector of the type described in claim 2 wherein the layer of compressible material surrounds a plurality of electrical contacts.

4. An electrical connector of the type described in claim 1 wherein the layer of compressible material comprises a material chosen from a group including urethane foam, polyurethane foam, polyethylene foam, silicone, and expanded fluoropolymers.

5. An electrical connector of the type described in claim 1 wherein the mating of an electrical connector provided a compression of the compressible layer to at least the inflection of the force-to-compression plot.

6. An electrical connector of the type described in claim 1 wherein during connector mating the compressible layer is compressed to a height of less than the initial height D of the electrical contacts prior to reaching the inflection of the force-to-compression plot.

7. An electrical connector of the type described in claim 6 wherein the compressible material provides a seal around the electrical contacts when mated with an electrical circuit element which compresses the layer of compressible material, said seal slowing the rate of ingress of liquid materials into the contact area.

8. An electrical connector of the type described in claim 1 wherein the compressible material provides a seal around the electrical contacts when mated with an electrical circuit element which compresses the layer of compressible material.

9. An electrical connector of the type described in claim 1 wherein the layer of compressible material includes an aperture for each of the electrical contacts.

10. An electrical connector of the type described in claim 9 wherein the compressed thickness of the compressible material is less than or equal to the compressed height of the movable electrical contacts.

11. An electrical connector of the type described in claim 9 wherein the mating circuit element has circuit pads which stand proud of the surface of the circuit element.

12. An electrical connector of the type described in claim 11 wherein the circuit pads of the mating circuit element protrude into openings in the compressible layer surrounding the movable electrical contacts, and wherein the thickness of the compressible material is slightly greater than the compressed height of the movable electrical contacts.

13. An electrical connector of the type described in claim 11 wherein the compressed thickness of the compressible material is at least as thick as the compressed height of the movable electrical contacts.

14. An electrical connector of the type described in claim 1 wherein the layer of compressible material includes a single aperture positioned and sized to surround a plurality of electrical contacts.

15. An electrical connector comprising:

A substrate having two generally opposing surfaces;

A plurality of movable electrical contacts mounted to at least a first surface of the substrate;

The plurality of movable electrical contacts having a distal end extending a distance D from the first surface of the substrate;

A layer of compressible material mounted to at least the first surface of the substrate, said layer of compressible material extending a thickness H, which is more than the distance D, from the substrate when uncompressed, and which when compressed against a mating circuit element or connector to a fully electrically mated configuration has a thickness less than the height D, the layer of compressible material having a force-to-compression plot which includes an inflection point defining a region of lower force and a second region of higher force and the amount of compression is determined considering the inflection point.

\* \* \* \* \*